(12) United States Patent
Takeya et al.

(10) Patent No.: US 11,156,641 B2
(45) Date of Patent: Oct. 26, 2021

(54) POWER DISTRIBUTION NETWORK MONITORING SYSTEM FOR DETECTING ABNORMALITIES

(71) Applicant: Omron Corporation, Kyoto (JP)

(72) Inventors: Hiroaki Takeya, Aichi (JP); Tatsuya Adachi, Ichinomiya (JP)

(73) Assignee: Omron Corporation, Kyoto (JP)

( * ) Notice: Subject to any disclaimer, the term of this patent is extended or adjusted under 35 U.S.C. 154(b) by 184 days.

(21) Appl. No.: 16/481,120

(22) PCT Filed: Nov. 24, 2017

(86) PCT No.: PCT/JP2017/042185
§ 371 (c)(1),
(2) Date: Jul. 26, 2019

(87) PCT Pub. No.: WO2018/168091
PCT Pub. Date: Sep. 20, 2018

(65) Prior Publication Data
US 2021/0132117 A1 May 6, 2021

(30) Foreign Application Priority Data
Mar. 15, 2017 (JP) .............................. JP2017-050386

(51) Int. Cl.
*G01R 11/02* (2006.01)
*H02J 13/00* (2006.01)
*G01R 21/00* (2006.01)

(52) U.S. Cl.
CPC .............. *G01R 11/02* (2013.01); *G01R 21/00* (2013.01); *H02J 13/00002* (2020.01); *H02J 13/00022* (2020.01)

(58) Field of Classification Search
CPC ........ Y04S 10/30; Y04S 10/52; Y04S 10/123; Y04S 10/00; Y04S 10/22; Y04S 20/221;
(Continued)

(56) References Cited

U.S. PATENT DOCUMENTS 4,689,752 A 8/1987 Fernandes et al.
4,794,328 A * 12/1988 Fernandes ......... H02J 13/00034
324/127
(Continued)

FOREIGN PATENT DOCUMENTS

JP S63-133844 A 6/1988
JP H11-341706 A 12/1999
(Continued)

OTHER PUBLICATIONS

International Search Report issued in Application No. PCT/JP2017/042185, dated Dec. 26, 2017 (4 pages).
(Continued)

*Primary Examiner* — Vinh P Nguyen
(74) *Attorney, Agent, or Firm* — Osha Bergman Watanabe & Burton LLP

(57) ABSTRACT

A power distribution network monitoring system includes a CT sensor and a power management device. The CT sensor includes a measurement component and a transmitter. The measurement component is installed at a plurality of predetermined positions along a power line constituting the power distribution network, and measures current of the power line at each predetermined position. The transmitter wirelessly transmits, as transmission data, the power spectrums of the fundamental wave, third harmonic, and fifth harmonic, as well as the effective current values used to detect abnormalities in the power distribution network, the data being at least part of the data measured by the measurement components. The power management device includes a receiver and a management database. The receiver receives the transmission data. The management database stores the received data.

25 Claims, 28 Drawing Sheets

(58) Field of Classification Search
CPC .......... Y04S 30/14; Y04S 50/00; Y04S 10/40; Y02E 60/00; Y02E 60/7853; G01R 19/2513; G01R 31/086; G01R 15/142; G01R 19/0092; G01R 15/18; G01R 19/16547; G01R 19/175; G01R 19/2506; G01R 21/001; G01R 21/1333; G01R 22/063; G01R 22/068; G01R 23/16; G01R 27/16; G01R 31/08; G01R 31/085; G01R 31/54; G01R 11/02; G06F 11/3006; G06F 3/0481; G01D 4/004; G01D 4/002; G01D 4/008; H01Q 1/2291; H04Q 9/00; H04Q 2209/60; H04Q 1/03; H04Q 2209/10; H04Q 2209/30; H04Q 2209/40; H04W 24/08; H04W 40/00; H04W 84/04; Y02T 10/70; Y02T 10/7072; Y02T 90/12; Y02T 90/16; Y02T 90/14; Y02T 90/167; Y02T 90/169; Y02T 10/64; Y02T 10/72; Y02T 90/168; F16L 1/11; F16L 3/12; F16L 57/00

See application file for complete search history.

(56) References Cited

U.S. PATENT DOCUMENTS

| | | | |
|---|---|---|---|
| 6,618,648 | B1 | 9/2003 | Shirota et al. |
| 9,330,563 | B2 * | 5/2016 | Rhoads .................. G01R 29/18 |
| 10,495,672 | B2 * | 12/2019 | Rieken ............... G01R 19/2513 |
| 2006/0071776 | A1 | 4/2006 | White et al. |
| 2006/0170410 | A1 | 8/2006 | Bjorn |
| 2016/0025778 | A1 | 1/2016 | Tokusaki et al. |
| 2016/0124400 | A1 | 5/2016 | Kanayama et al. |
| 2016/0164290 | A1 | 6/2016 | Hall et al. |
| 2018/0128862 | A1 * | 5/2018 | Satoh ...................... H02J 3/381 |
| 2019/0187736 | A1 | 6/2019 | Toizumi et al. |
| 2021/0011071 | A1 * | 1/2021 | Adachi .................... H04Q 9/00 |

FOREIGN PATENT DOCUMENTS

| | | |
|---|---|---|
| JP | 2005-24469 A | 1/2005 |
| JP | 2006-109545 A | 4/2006 |
| JP | 2007-244098 A | 9/2007 |
| JP | 2008-61448 A | 3/2008 |
| JP | 2009-207321 A | 9/2009 |
| JP | 2013-223359 A | 10/2013 |
| JP | 2014-178238 A | 9/2014 |
| JP | 2015-76955 A | 4/2015 |
| JP | 2015-184179 A | 10/2015 |
| JP | 2017-34752 A | 2/2017 |
| WO | 2016/194814 A1 | 12/2016 |

OTHER PUBLICATIONS

Written Opinion issued in International Application No. PCT/JP2017/042185, dated Dec. 26, 2017 (12 pages).
International Search Report issued in corresponding Application No. PCT/JP2017/042187, dated Dec. 26, 2017 (4 pages).
Written Opinion issued in corresponding International Application No. PCT/JP2017/042187, dated Dec. 26, 2017 (10 pages).
Office Action issued in U.S. Appl. No. 16/481,142; dated Sep. 17, 2020 (25 pages).

* cited by examiner

Setting information table

| | | | | | |
|---|---|---|---|---|---|
| 91 | Relay management code | A01_01 | | | |
| | CT sensor ID | 001 | 002 | ... | 00n |
| | Time information | 2017/2/6/10:00:08 | | | |

FIG. 8

Measurement information table 92

| CT sensor ID | Time information | Effective value | Power spectrum |
|---|---|---|---|
| 001 | 2017/2/6/09:02:30 | 100mA | fundamental wave:100db,third harmonic wave:0db,fifth harmonic wave:0db |
| | 2017/2/6/09:08:30 | 101mA | fundamental wave:95db,third harmonic wave:1db,fifth harmonic wave:0db |
| | 2017/2/6/09:14:30 | 105mA | fundamental wave:95db,third harmonic wave:10db,fifth harmonic wave:0db |
| | 2017/2/6/09:20:30 | 107mA | fundamental wave:92db,third harmonic wave:5db,fifth harmonic wave:0db |
| | 2017/2/6/09:26:30 | 106mA | fundamental wave:98db,third harmonic wave:0db,fifth harmonic wave:0db |
| | 2017/2/6/09:32:30 | 104mA | fundamental wave:101db,third harmonic wave:3db,fifth harmonic wave:1db |
| | 2017/2/6/09:38:30 | 108mA | fundamental wave:105db,third harmonic wave:4db,fifth harmonic wave:5db |
| | 2017/2/6/09:44:30 | 103mA | fundamental wave:94db,third harmonic wave:3db,fifth harmonic wave:3db |
| | 2017/2/6/09:50:30 | 105mA | fundamental wave:103db,third harmonic wave:12db,fifth harmonic wave:10db |
| | 2017/2/6/09:56:30 | 104mA | fundamental wave:91db,third harmonic wave:32db,fifth harmonic wave:21db |
| | ..... | ..... | ..... |
| 002 | .. | | |

Setting information table

| Area code | Relay management code | Group ID | Classification ID | CT sensor ID |
|---|---|---|---|---|
| A01 | A01_01 | R | BR00 | 001 |
| | | | | 002 |
| | | | BR01 | 003 |
| | | S | BR00 | ⋮ |
| | | | BR01 | ⋮ |
| | | T | BR00 | ⋮ |
| | | | BR01 | n |
| | A01_02 | R | BR00 | 001 |
| | | | | 002 |
| | | | BR01 | ⋮ |
| | | S | BR00 | ⋮ |
| | | | BR01 | ⋮ |
| | | T | BR00 | ⋮ |
| | | | BR01 | m |
| | ⋮ | ⋮ | ⋮ | ⋮ |

93

| Time information | 2017/2/6/09:58:55 |
|---|---|

FIG. 10

Measurement information table

| Area code | Relay management code | CT sensor ID | Time information | Effective value | Power spectrum |
|---|---|---|---|---|---|
| A01 | A01_01 | 001 | 2017/2/6/09:02:30 | 100mA | fundamental wave:100db,third harmonic wave:0db,fifth harmonic wave:0db |
| | | | 2017/2/6/09:08:30 | 101mA | fundamental wave:95db,third harmonic wave:1db,fifth harmonic wave:0db |
| | | | 2017/2/6/09:14:30 | 105mA | fundamental wave:95db,third harmonic wave:10db,fifth harmonic wave:0db |
| | | | 2017/2/6/09:20:30 | 107mA | fundamental wave:92db,third harmonic wave:5db,fifth harmonic wave:0db |
| | | | 2017/2/6/09:26:30 | 106mA | fundamental wave:98db,third harmonic wave:0db,fifth harmonic wave:0db |
| | | | 2017/2/6/09:32:30 | 104mA | fundamental wave:101db,third harmonic wave:3db,fifth harmonic wave:1db |
| | | | 2017/2/6/09:38:30 | 108mA | fundamental wave:105db,third harmonic wave:4db,fifth harmonic wave:5db |
| | | | 2017/2/6/09:44:30 | 103mA | fundamental wave:94db,third harmonic wave:3db,fifth harmonic wave:3db |
| | | | 2017/2/6/09:50:30 | 105mA | fundamental wave:103db,third harmonic wave:12db,fifth harmonic wave:10db |
| | | | 2017/2/6/09:56:30 | 104mA | fundamental wave:91db,third harmonic wave:32db,fifth harmonic wave:21db |
| | | | : | | |

Position information management table

| Area code | Relay management code | CT sensor ID | Position code |
|---|---|---|---|
| A01 | A01_01 | 001 | 35.323890,136.758432 |
| | | 002 | 35.323892,136.758434 |
| | ... | ... | ... |
| | A01_m | 002 | 35.324471, 136.761068 |
| | A02_01 | 001 | 35.170220, 136.882467 |
| | ... | ... | ... |

Abnormality management table 96

| Area code | Relay management code | CT sensor ID | State | | | |
|---|---|---|---|---|---|---|
| | | | Overload | Imbalance | Loss | Harmonic |
| A01 | A01_01 | 001 | normal | normal | normal | normal |
| | | 002 | warning Lv1 | normal | normal | normal |
| | ... | ... | ... | ... | ... | ... |
| | A01_m | 002 | normal | normal | normal | normal |
| | A02_01 | 001 | normal | warning Lv3 | warning Lv1 | normal |
| | ... | ... | ... | ... | ... | ... |

FIG. 13

POWER DISTRIBUTION NETWORK MONITORING SYSTEM FOR DETECTING ABNORMALITIES

FIELD

The present invention relates to a power distribution network monitoring system for detecting abnormalities in a power distribution network.

BACKGROUND

Conventionally, monitoring of a power distribution network has been performed by periodic patrols by workers. During a patrol, the worker performs electrical measurement on a power line at predetermined positions or in between predetermined positions to detect any abnormalities in the power distribution network.

In performing the electrical measurements in such patrols, the worker uses a management device that is attached to the power line and measures the electrical current flowing through the power line by means of a CT (current transformer) (see Patent Literature 1, for example).

CITATION LIST

Patent Literature

Patent Literature 1: JP-A 2014-178238

SUMMARY

However, in the monitoring of a power distribution network as described above, it is necessary for a number of workers to visit the measurement sites in the course of a patrol, so the measurement takes a long time and costs a considerable amount. Also, abnormalities cannot be detected during the period in between regular patrols, which makes it difficult to detect sudden abnormalities quickly.

It is an object of the present invention to provide a power distribution network monitoring system capable of detecting abnormalities quickly and at low cost.

Solution to Problem

The power distribution network monitoring system of the first invention comprises a measuring instrument and a management device. The measuring instrument has measurement components and a transmitter. The measurement components are installed at a plurality of predetermined positions along a power line constituting a distribution network, and perform electrical measurement of the power line at each of the predetermined positions. The transmitter wirelessly transmits, as transmission data, detection data that is at least part of the data measured by the measurement components and is used for the detection of abnormalities in the distribution network and/or detection result data about the result of using the detection data to perform abnormality detection. The management device has a receiver and a storage component. The receiver receives the transmission data. The storage component stores the received data.

Thus, the electrical measurement of a power line constituting a distribution network is performed using the measuring instrument, and the detection data that is at least part of the measurement data or the detection data, or detection result data about the result of using the detection data to perform abnormality detection, is transmitted to the management device.

Accordingly, the management device can automatically receive data used for detecting abnormalities or data about a detection result, workers do not have to periodically patrol and perform monitoring, and the cost can be reduced.

Also, since communication can be performed wirelessly, the measuring instrument can perform data communication with a host system such as a management device in a non-contact manner.

Also, since the measuring instrument is always installed on the power line, electrical measurement of the power line can be performed whenever desired, and an abnormality in the power distribution network can be detected quickly.

Furthermore, although the receiver receives transmission data wirelessly transmitted from the transmitter of the measuring instrument, it need not receive it directly from the transmitter, and may instead receive it indirectly via another device. Also, when data is indirectly received, another device may wirelessly receive it from the transmitter of the measuring instrument and transmit it to the detection device by wire.

The power distribution network monitoring system of the second invention is the distribution network monitoring system of the first invention, wherein the transmission data includes the detection data. The management device has an abnormality detector that uses the detection data to detect abnormalities in the power distribution network. The storage component of the management device stores detection result data about the results of abnormality detection.

This makes it possible for the management device to automatically detect an abnormality in the power distribution network.

The power distribution network monitoring system according to the third invention is the power distribution network monitoring system according to the second invention, further comprising a relay. The relay wirelessly receives detection data from a plurality of measuring instruments, and transmits the detection data to the receiver of the management device.

Consequently, the relay can transmit the data to the management device after first collecting the detection data from a plurality of measuring instruments.

The power distribution network monitoring system of the fourth invention is the power distribution network monitoring system of the second invention, wherein the management device has a transmitter that transmits the detection result data. The power distribution network monitoring system further comprises a host management device. This host management device comprises a receiver and a storage component. The receiver receives the detection result data transmitted from the management device. The storage component stores the detection result data. The management device relays data so as to receive the detection data from the measuring instruments and transmit the detection result data to the management device.

Consequently, the management device functions as a relay that relays data between the host management device and the measuring instrument, abnormalities can be detected at the management device, and the abnormality detection result can be transmitted to the host management device. Therefore, the amount of data transmitted to the host management device can be reduced, and the power consumption used for data transmission can be kept lower.

Also, storing the abnormality detection result data in the management device (which serves as a relay) also provides a backup of the host management device.

The connection between the management device and the host management device may be wireless or wired.

The power distribution network monitoring system of the fifth invention is the power distribution network monitoring system of the first invention, wherein the measuring instrument has an abnormality detector. The abnormality detector uses the detection data to detect abnormalities in the distribution network. The transmission data includes detection result data. The storage component of the management device stores the detection result data.

Consequently, an abnormality can be detected at the measuring instrument, and this abnormality detection result can be transmitted to the management device. Therefore, the amount of data transmitted to the management device can be reduced, and the power consumption used for data transmission can be kept lower. For example, when an abnormality related to a harmonic is detected at a measuring instrument, only the detection result for the abnormality related to the harmonic need be transmitted, and it is not necessary to transmit data for detecting abnormalities related to harmonics to the management device.

Also, data processing in a host system such as a management device can be simplified. At the same time, a reduction in transmission data makes it possible to increase the number of measuring instruments that are connected to the management device.

The power distribution network monitoring system of the sixth invention is the power distribution network monitoring system of any of the second to fourth inventions, wherein the abnormality detector detects at least one of the following kinds of abnormality: an abnormality related to overload, an abnormality related to the balance of power in three power lines constituting three phases, an abnormality related to power loss, and an abnormality related to a harmonic wave.

As a result, it is possible to detect what kind of abnormality it is, making it easier to deal with the abnormality.

The power distribution network monitoring system of the seventh invention is the power distribution network monitoring system of the fifth invention, wherein the abnormality detector detects at least one of the following kinds of abnormality: an abnormality related to overload and an abnormality related to a harmonic wave.

As a result, it is possible to detect what kind of abnormality it is, making it easier to deal with the abnormality.

The power distribution network monitoring system of the eighth invention is the power distribution network monitoring system of any of the second to fifth inventions, wherein the detection data includes information about the effective value of the current of the power line. The abnormality detector detects abnormalities in the power distribution network on the basis of the effective value of the current.

Thus measuring current as an electrical measurement of the power line and finding the effective value of the current makes it possible to detect abnormalities in the power distribution network.

The power distribution network monitoring system of the ninth invention is the power distribution network monitoring system of any of the second to fifth inventions, wherein the detection data includes information about the fundamental wave of the current of the power line and about harmonic waves with respect to this fundamental wave. The abnormality detector detects abnormalities in the power distribution network on the basis of information about the fundamental wave and harmonics of the current.

Thus measuring current as an electrical measurement of the power line and finding the fundamental wave and the harmonics from the waveform of the current makes it possible to detect abnormalities in the power distribution network.

The power distribution network monitoring system of the tenth invention is the power distribution network monitoring system of any of the second to fifth inventions, wherein the detection data includes information about the effective value of the current of the power line. The abnormality detector detects the occurrence of an abnormality related to overload at a predetermined position when the effective value is above a preset threshold.

This makes it possible to detect that an overload has occurred at a predetermined position. Also, since the measuring instruments are installed at a plurality of positions along the power line, setting an appropriate threshold value for each of the plurality of positions makes it possible to properly detect an overload abnormality at a plurality of sites.

The power distribution network monitoring system of the eleventh invention is the power distribution network monitoring system of any of the second to fourth inventions, wherein the detection data includes information about the effective value of the current of the power line. The measuring instruments are attached to each of three power lines arranged in parallel to form three phases. The abnormality detector detects the occurrence of an abnormality related to the balance of power in the three power lines on the basis of the effective value of each of the power lines.

Thus, installing measuring instruments on each of the R-phase, T-phase, and S-phase power lines allows the occurrence of a power balance abnormality to be detected.

The power distribution network monitoring system of the twelfth invention is the power distribution network monitoring system of the eleventh invention, wherein the abnormality detector detects that a balance abnormality has occurred in the three power lines when a degree of deviation from an overall average value of the most diverging average effective value is larger than a preset threshold. The most diverging average effective value is the most out of the overall average value among the average effective values in a predetermined period of the effective value calculated for each of the three power lines. The overall average value is an average value of three average effective values.

Setting the threshold value to the upper limit value of the allowable range for balance abnormalities allows a three-phase balance abnormality to be detected.

The power distribution network monitoring system of the thirteenth invention is the power distribution network monitoring system of any of the second to fourth inventions, wherein the detection data includes information about the effective value of the current of the power line. The measuring instruments are provided at two places along a specific power line of the power distribution network and to all of the branch lines branching off from between the two points of the specific power line. The abnormality detector detects that an abnormality related to power loss between the two locations of the specific power line has occurred on the basis of the effective values at the two locations of the specific power line and of the effective values of all the branch lines.

An abnormal power loss in a predetermined area (such as theft of electrical power) can be found by calculating the effective values of current at the entrance and exit of the electricity to and from a specific area of the power distribution network and the effective values of the current consumed in the specific area.

The power distribution network monitoring system of the fourteenth invention is the power distribution network monitoring system of the thirteenth invention, wherein the abnormality detector detects that an abnormality related to power loss has occurred when the ratio of a loss amount (the remainder of subtracting a usage amount (the sum of the average effective values in a predetermined period of the effective value of each branch line) from a reduction amount (the difference between the average effective value in a predetermined period of the effective value on the upstream side, out of the two locations of a specific power line, and the average effective value in the predetermined period of the effective value on the downstream side)) to the usage amount is above a predetermined threshold.

For example, setting the threshold value to the upper limit of the normal amount of power loss between two points makes it possible to determine that an abnormality related to power loss has occurred when the threshold value is exceeded.

The power distribution network monitoring system of the fifteenth invention is the power distribution network monitoring system of any of the second to fourth inventions, wherein the measuring instruments are provided at two locations of a specific power line of the power distribution network. The abnormality detector detects that an abnormality related to power loss has occurred between the two locations of the specific power line on the basis of the effective values at the two locations of the specific power line.

As a result, an abnormal power loss, such as theft of electrical power, can be detected in a power line in which no branch is provided.

The power distribution network monitoring system of the sixteenth invention is the power distribution network monitoring system of any of the second to fifth inventions, wherein the detection data includes information about the fundamental wave of the current of the power line and about harmonics with respect to this fundamental wave. The information related to the fundamental wave and harmonics is the power spectrum of the fundamental wave and the harmonics obtained from the current. The abnormality detector detects that an abnormality related to harmonics has occurred when the ratio of the harmonics to the fundamental wave is above a preset threshold.

When a harmonic is generated, there is a possibility that it will affect electronic devices, etc., but this makes it possible to quickly detect the occurrence of a harmonic and deal with it.

The power distribution network monitoring system of the seventeenth invention is the power distribution network monitoring system of any of the tenth, twelfth, fourteenth, and sixteenth inventions, wherein a plurality of the thresholds are set such that the value increases in stages. The abnormality detector determines that the degree of abnormality is greater in proportion to how much a large threshold is exceeded.

Since the degree of abnormality can be determined in this way, the larger is the degree of abnormality, the more quickly it can be dealt with.

For instance, a threshold can be set for the value of a warning level, the value of a required action level, and the value of an emergency action level, and an action priority ranking can be determined.

The power distribution network monitoring system of the eighteenth invention is the power distribution network monitoring system of any of the first to seventeenth inventions, wherein the transmitter of the measuring instrument transmits measuring instrument identification information unique to that measurement device along with the transmission data. The storage component of the management device stores the transmission data in association with the measuring instrument identification information.

This tells which measuring instrument has detected the abnormality, which makes it easier to deal with it.

The power distribution network monitoring system of the nineteenth invention is the power distribution network monitoring system of any of the first to eighteenth inventions, wherein the measuring instrument transmits time information related to the transmission data along with the transmission data. The storage component of the management device stores the transmission data in association with the time information.

Consequently, the time at which the abnormality was detected, or the time at which the detection data was measured can be managed. Therefore, when it is confirmed that a harmonic is detected at a specific time, for example, it is possible to surmise that the harmonic is being generated from a facility, device, or the like operating at that specific time.

The power distribution network monitoring system of the twentieth invention is the power distribution network monitoring system of any of the first to eighteenth inventions, wherein the storage component of the management device adds time information related to the transmission data to the transmission data, and stores this time information in association with the transmission data.

Consequently, the time at which the abnormality was detected or the time at which the detection data was measured can be managed. Therefore, when it is confirmed that a harmonic is detected at a specific time, for example, it is possible to surmise that the harmonic is being generated from a facility, device, or the like operating at that specific time.

The power distribution network monitoring system of the twenty-first invention is the power distribution network monitoring system of any of the first to seventeenth, nineteenth, and twentieth inventions, wherein the storage component of the management device associates and stores measuring instrument identification information unique to each of the measuring instruments, and information related to the installation location of each of the measuring instruments.

This tells the position of the measuring instrument that has detected the abnormality, which makes it easier to deal with it.

The power distribution network monitoring system of the twenty-second invention is the power distribution network monitoring system of any of the second to fifth inventions, wherein the management device or the measuring instruments have a notification unit that sends a notification related to the abnormality when the abnormality detector detects an abnormality.

This makes it possible to advise the maintenance management center or the like that maintains the power distribution network, allowing them to take prompt action.

Also, if the management device functions as a relay for the host management device and the measuring instrument, notification about abnormalities may be performed at the relay. This makes it easier to discover abnormalities in the relay itself.

Furthermore, notification about abnormalities may be performed at the measuring instrument, and if the measuring instrument is installed on a power line used by a house or a factory, it is possible to notify the people living in the house or the workers of the factory of that anomaly.

The power distribution network monitoring system of the twenty-third invention is the power distribution network monitoring system of the first invention, further comprising a plurality of relays. These relays relay the transmission data between the measuring instruments and the management device. The plurality of measuring instruments are divided into a plurality of groups. Each of the relays receives the transmission data and the measuring instrument identification information unique to that measuring instrument from the plurality of measuring instruments belonging to each of these groups, and transmits to the management device relay identification information unique to the relay, along with the transmission data and the measuring instrument identification information, and the storage component of the management device stores the transmission data in association with measuring instrument identification information and relay identification information.

A relay can therefore handle a plurality of measuring instruments for each group, and it is possible to identify which measuring instrument has detected an abnormality.

Also, detection data or detection result data for measuring instruments in a group not handled can be excluded as unnecessary data.

The power distribution network monitoring system of the twenty-fourth invention is the power distribution network monitoring system of the sixth or seventh invention, wherein the management device further has a notification unit that sends a notification about the type of the abnormality when the abnormality detector detects any of the abnormalities.

This makes it possible to advise the maintenance management center or the like that maintains the power distribution network, allowing them to take prompt action.

Also, depending on the type of abnormality, it is also possible to vary the measure that is taken, such as dispatching a worker or informing the user of the power line on which the measuring instrument is installed.

The power distribution network monitoring system of the twenty-fifth invention is the power distribution network monitoring system of any of the first to twenty-fourth inventions, wherein the measuring instruments each have a storage component that stores detection result data.

This allows abnormal events to be stored as a log in the measuring instrument.

The power distribution network monitoring system of the twenty-sixth invention is the power distribution network monitoring system of any of the first to twenty-fifth inventions, wherein the measuring instruments further have a power supply unit that makes use of electricity flowing through the power line to supply power to the measurement component.

Thus, electrical measurement of the power line can be performed without using a power supply wire.

Advantageous Effects

The present invention provides a power distribution network monitoring system capable of detecting abnormalities quickly and at low cost.

BRIEF DESCRIPTION OF THE DRAWINGS

FIG. 8 is a measurement information table stored in the management database of the data collection relay in FIG. 3;

FIG. 10 is a setting information table stored in the management database of the power management device in FIG. 3;

FIG. 11 is a measurement information table stored in the management database of the power management device in FIG. 3;

FIG. 12 is a position information management table stored in the management database of the power management device in FIG. 3;

FIG. 13 is an abnormality management table, which is a log of abnormalities recorded in the management database of the power management device in FIG. 3;

DETAILED DESCRIPTION

The power distribution network monitoring system according to an embodiment of the present invention will now be described on the basis of the drawings.

Configuration

Overview of Power Distribution Network System 10

Figure 1:
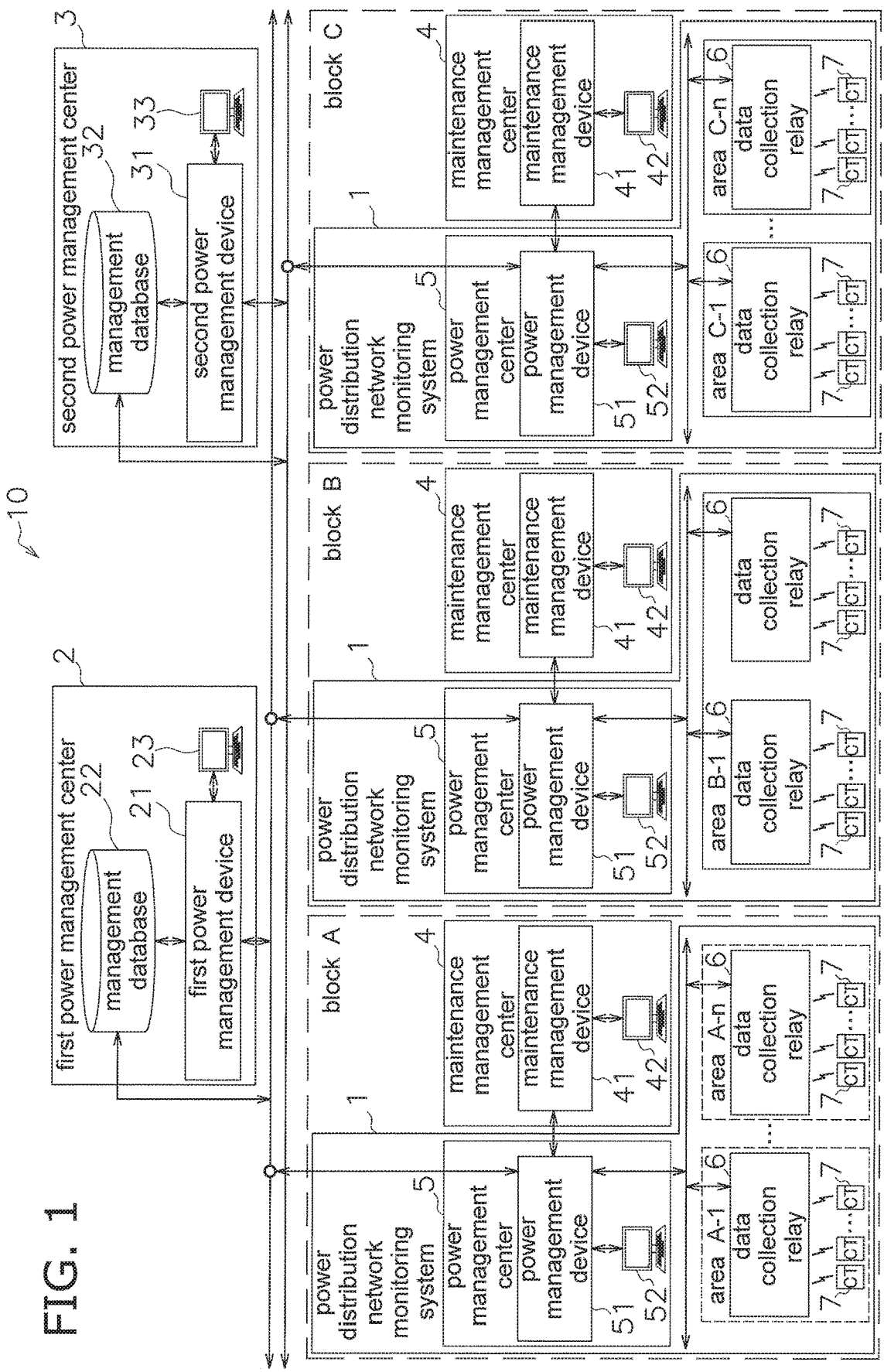
FIG. 1 is a block diagram of the configuration of a system featuring the power distribution network monitoring system in an embodiment of the present invention.

FIG. 1 is a block diagram of the configuration of the power distribution network system 10 according to an embodiment of the present invention.

The power distribution network monitoring system 1 in an embodiment of the present invention is provided to the power distribution network system 10. The power distribution network monitoring system 1 monitors a power distribution network and detects abnormalities by using a plurality of CT (current transformer) sensors installed at predetermined positions of the power distribution lines constituting the power distribution network.

A first power management center 2 and a second power management center 3 are provided to the power distribution network system 10 of this embodiment. The first power management center 2 manages the power distribution network in block A and block B, and the second power management center 3 manages the power distribution network in block C. Here, the first power management center 2 and the second power management center 3 are, for example, management centers provided to Kansai Electric Power, Chubu Electric Power, or the like. Also, blocks A and B indicate, for example, prefectures covered by Kansai Electric Power, such as Osaka Prefecture or Nara Prefecture, and block C indicates prefectures covered by Chubu Electric Power, such as Aichi Prefecture.

The power distribution network system 10 in this embodiment comprises the power distribution network monitoring system 1 and a maintenance management center 4 for each of the blocks A, B, and C. The power distribution network monitoring system 1 monitors the power distribution network in each block and detects abnormalities. The maintenance management center 4 performs maintenance management for each block on the basis of the detection result from the power distribution network monitoring system 1.

The power distribution network monitoring system 1 has a power management center 5, a plurality of data collection relays 6, and a plurality of CT sensors 7. The power management center 5 manages the power in each block and detects abnormalities in the power distribution network within a block. The data collection relays 6 acquire data from the CT sensors 7. A plurality of CT sensors 7 are installed in each of the electrical areas flowing through the distribution line, and measure the current of the distribution line.

The current of the distribution line is measured by the CT sensors 7, data is sent from the CT sensors 7 to the power management center 5 via the data collection relays 6, and the power management center 5 performs detecting abnormalities on the basis of this data.

Here, the term "area" indicates, for example, a section transmitted from a predetermined substation in a block, or a municipal section such as a city or a town.

In block A, one data collection relay 6 is provided for each of a plurality of areas A-1 to A-n, and the data of a plurality of CT sensors 7 installed in one area is collected by a single collection relay 6. In block B, a plurality of data collection relays 6 are provided in one area B-1, and the data of the plurality of CT sensors 7 installed in one area is collected by a plurality of data collection relays 6. In the case of block B, the plurality of CT sensors 7 are divided into groups, and each data collection relay 6 collects data from the plurality of CT sensors 7 belonging to that group. In block A, it could also be said that one area handled by one data collection relay 6 constitutes one group. Thus, only one data collection relay 6 may be provided in the area, or a plurality of data collecting relays 6 may be provided.

Installation of Data Collection Relays and CT Sensors

Figure 2:
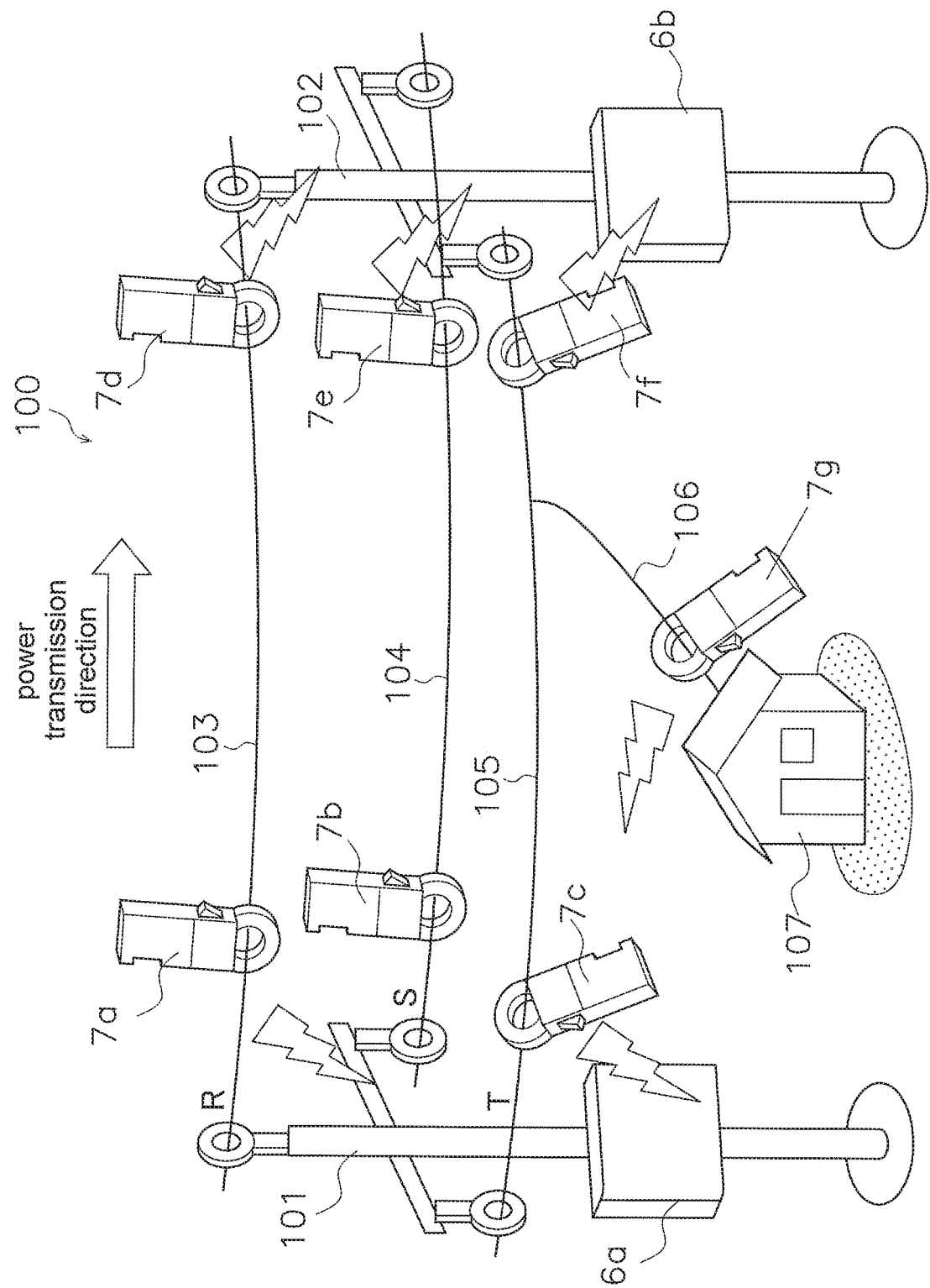
FIG. 2 shows the installation sites of the data collection relays and CT sensors in FIG. 1.

FIG. 2 shows the installation sites of the data collection relays 6 and CT sensors 7 in a power distribution network 100. In FIG. 2, a power pole 101 on the upstream side in the power transmission direction and a power pole 102 on the downstream side are shown, and distribution lines 103, 104, and 105, serving as three trunk lines constituting three phases of RTS, are strung between the power pole 101 and the power pole 102. Electricity flows from the power pole 101 toward the power pole 102. The distribution line 103 is an R-phase distribution line, the distribution line 104 is an S-phase distribution line, and the distribution line 105 is a T-phase distribution line. Also, a distribution line 106 branches off from the distribution line 105, and is connected to the electrical box of a house 107.

A data collection relay 6 is installed on each of the power poles 101 and 102. In order to distinguish them by location, the data collection relay 6 installed on the power pole 101 is numbered 6a, and the data collection relay 6 installed on the power pole 102 is 6b.

The CT sensors 7 are a clamp type, and are detachably installed on a distribution line (an example of a power line). The CT sensors 7 are installed near the power pole 101 and near the power pole 102 on each of the distribution lines 103, 104, and 105. A CT sensor 7 is also installed near the house 107 on the distribution line 106.

Here, a to f are added to the reference numbers of the CT sensors 7 so that they can be distinguished by their location in the description that follows. The CT sensor 7 installed near the power pole 101 on the distribution line 103 is labeled 7a, the CT sensor 7 installed near power pole 101 on the distribution line 104 is 7b, and the CT sensor 7 installed near the power pole 101 on the distribution line 105 is 7c. The CT sensor 7 installed near the power pole 102 on the distribution line 103 is labeled 7d, the CT sensor 7 installed near the power pole 102 on the distribution line 104 is 7e, and the CT sensor 7 near the power pole 102 on the distribution line 105 is 7f. The CT sensor 7 installed on the distribution line 106 is labeled 7g.

In FIG. 2, the data of the CT sensors 7a, 7b, 7c, and 7g is transmitted to the data collection relay 6a, and the data of the CT sensors 7d, 7e, and 7f is transmitted to the data collection relay 6b. Communication between the CT sensors 7 and the data collection relays 6 is performed wirelessly as discussed below.

CT Sensors

Figure 3:
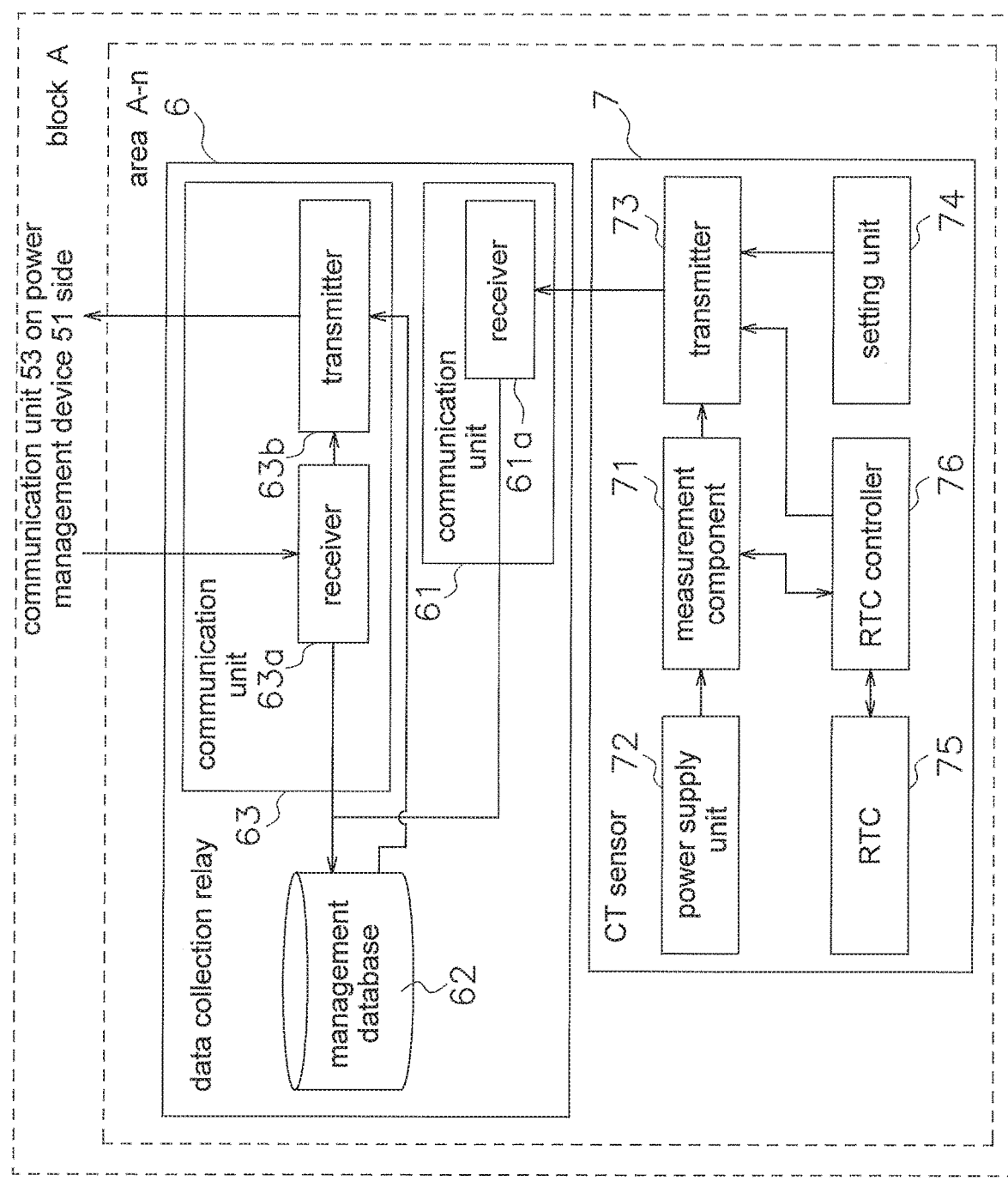
FIG. 3 is a block diagram of the configuration of the data collection relays and CT sensors in FIG. 1.

FIG. 3 is a block diagram of the configuration of a data collection relay 6 and a CT sensor 7.

As shown in FIG. 3, the CT sensor 7 includes a measurement component 71, a power supply unit 72, a transmitter 73, a setting unit 74, an RTC (real time clock) 75, and an RTC controller 76, and can be removably attached to the distribution line. The measurement component 71 measures the trend of the current flowing through the distribution line by the power supply from the power supply unit 72. More precisely, the measurement component 71 has a coil unit removably attached around the distribution line, a shunt resistor for measuring the current flowing through the coil unit, and so forth. The current flowing through the distribution line can be sensed by measuring the voltage across the shunt resistor.

In addition, the measurement component 71 is provided with an operation unit (not shown), and the effective value of the current, as well as the power spectrum values (dB) of the fundamental wave, the third harmonic, and the fifth harmonic of the current are calculated from the waveform of the sensed current.

The power supply unit 72 stores electricity generated in the coil unit, and supplies this electricity to the measurement component 71. A component is provided for switching the direction of the current generated in the coil unit to the shunt resistor side or the power supply unit 72 side, and when power is stored in the power supply unit 72, the current generated in the coil unit is not supplied to the shunt resistor, but is supplied to the power supply unit 72. Also, when the measurement component 71 measures the current, electricity does not flow to the power supply unit 72 side.

The setting unit 74 sets a sensor ID (identification) for identifying the CT sensor 7 (an example of measuring instrument identification information).

The RTC controller 76 acquires from the RTC 75 time information about the timing at which the measurement component 71 measures the current waveform, and transmits this time information to the transmitter 73.

The transmitter 73 wirelessly transmits to the data collection relay 6 the data measured and calculated by the measurement component 71 (the effective value of the current and the values (dB) of the power spectrum of the fundamental wave, the third harmonic, and the fifth harmonic). This data is detection data that is used to detect abnormalities in the power management device 51.

In addition to the detection data, the transmitter 73 also sends the sensor ID set by the setting unit 74 and the time information acquired by the RTC controller 76 as measurement information (an example of transmission data) in association with the detection data. The term "time information" refers to the clock time at which the detection data was measured. The time information from the RTC controller 76 may be transmitted to the measurement component 71 and time information may be added to the detection data at the measurement component 71, or the measurement information may be transmitted from the measurement component 71 to the RTC controller 76 and the time information may be added to the detection data at the RTC controller 76.

Also, the CT sensor 7 transmits the sensor ID, time information, and detection data to the data collection relay 6 periodically, such as at six-minute intervals.

Data Collection Relay

As shown in FIG. 3, the data collection relay 6 has a communication unit 61, a management database 62, and a communication unit 63.

The communication unit 61 communicates with a plurality of CT sensors 7. The communication unit 61 has a receiver 61a, and receives the measurement information (sensor ID, time information, and detection data) transmitted wirelessly from the plurality of CT sensors 7.

The management database 62 stores (as a table) and manages the setting information (see the setting information table 91 in FIG. 7 (discussed below)) and measurement information data (see the measurement information table 92 in FIG. 8 (discussed below)) transmitted from the plurality of CT sensors 7.

The communication unit 63 communicates with the power management device 51. The communication unit 63 has a receiver 63a and a transmitter 63b. The receiver 63a receives a setting request and a data acquisition request from the power management device 51 of the power management center 5. The data acquisition request is transmitted periodically (for example, every 60 minutes) from the power management center 5. The setting request requests the setting of the management code of the data collection relay 6. The transmitter 63b transmits the sensor ID, time information, detection data, and a relay management code (an example of relay identification information) to the power management center 5.

Power Management Center

The power management center 5 has a power management device 51 and a display unit 52. The power management device 51 uses the detection data received from the data collection relay 6 to detect abnormalities in the power distribution network.

Figure 4:
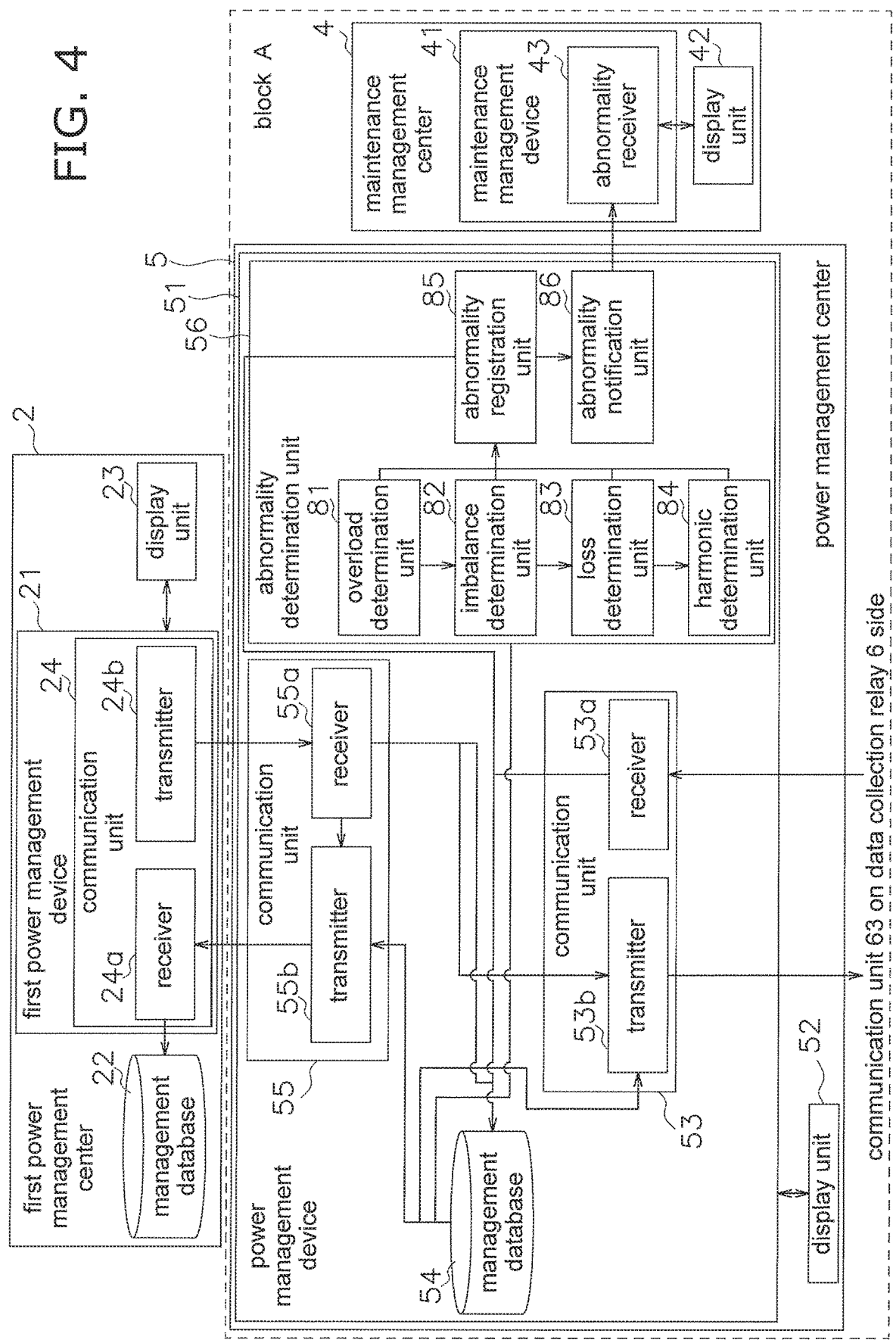
FIG. 4 is a block diagram of the configurations of the first power management center and second power management center in FIG. 1.

FIG. 4 is a block diagram of the configurations of the first power management center 2 and the power management center 5. As shown in FIG. 4, the power management device 51 has a communication unit 53, a management database 54, a communication unit 55, and an abnormality determination unit 56. The communication unit 53 communicates with the data collection relay 6. The communication unit 53 has a receiver 53a and a transmitter 53b. As shown in FIG. 1, the receiver 53a receives the sensor ID, time information, detection data, and relay management code transmitted from the transmitters 63b of the plurality of data collection relays 6. The transmitter 53b transmits a setting request and a data acquisition request to each data collection relay 6.

The management database 54 stores the relay management code, sensor ID, time information, and detection data received through the receiver 53a. As described above, since the detection data is transmitted from the CT sensor 7 to the data collection relay 6 every six minutes, if a data acquisition request is transmitted to the data collection relay 6 every 60 minutes, the detection data for 10 times will be transmitted all at once from the data collection relay 6 to the power management device 51. The management database 54 stores this detection data (the effective value of the current, and the values (dB) of the power spectrum of the fundamental wave, the third harmonic and the fifth harmonic) in a table along with the sensor ID, time information, relay management code, and area code.

The management database 54 also stores thresholds for detecting an abnormality, as well as detection result data (whether or not there is an abnormality, the type of abnormality, and the degree of abnormality). The management database 54 also stores and updates the setting information received from the first power management center 2.

The communication unit 55 communicates with the first power management center 2. The communication unit 55 has a receiver 55a and a transmitter 55b. The receiver 55a receives setting information from the first power management center 2. The transmitter 55b transmits the detection result data to the first power management center 2.

The abnormality determination unit 56 detects abnormalities in the power distribution network on the basis of the detection data stored in the management database 54. The abnormality determination unit 56 has an overload determination unit 81, an imbalance determination unit 82, a loss determination unit 83, a harmonic determination unit 84, an abnormality registration unit 85, and an abnormality notification unit 86.

The overload determination unit 81 detects that an overload abnormality has occurred when a current having a value larger than a preset current range flows through the distribution line at the location where each CT sensor 7 is installed. This will be described in more detail below, but an overload abnormality can be determined from the effective current value of each of the CT sensors 7a to 7f shown in FIG. 2.

The imbalance determination unit 82 determines an imbalance in the current flowing through the RST three-phase distribution line. An imbalance in the current flowing through the distribution lines 103, 104, and 105 can be determined from the effective current values detected by the CT sensors 7a, 7b, and 7c shown in FIG. 2. Also, imbalance in the current flowing through the distribution lines 103, 104, and 105 can be determined from the effective values detected by the CT sensors 7d, 7e, and 7f.

The loss determination unit 83 determines that the loss in a predetermined area of the power distribution network is abnormal. For instance, in FIG. 2, the CT sensors 7c, 7f, and 7g can be used to detect abnormal loss of power in a predetermined area of the distribution lines 105 and 106. The CT sensor 7c is installed at the entrance of a predetermined area of the distribution lines 105 and 106. The CT sensor 7f is installed at the exit of the predetermined area. The CT sensor 7g is installed near a house 107 using electricity in the predetermined area. These CT sensors 7c, 7f, and 7g find the amount by which electric power is decreasing in the predetermined area from the difference between the entrance and the exit of the predetermined area, and find the amount of electric power being used in the predetermined area from the amount of power used in the house. If the difference is abnormally larger than the power usage, it is determined that an abnormal loss of power is occurring, and it is considered that some abnormality such as power theft or electrical leakage is occurring in the predetermined area.

Also, in FIG. 2, no branch line is provided to the distribution line 103 between the power pole 101 and the power pole 102. Therefore, if the difference between the effective value of the current detected by the CT sensor 7a in FIG. 2 and the effective value of the current detected by the CT sensor 7d is large, it is possible to detect theft or the like along the distribution line 103.

The harmonic determination unit 84 detects whether or not the current supplied through the distribution line includes a harmonic component. The harmonic determination unit 84 uses the value (dB) of the power spectrum of the fundamental wave, the third harmonic, and the fifth harmonic in the detection data to detect whether or not the fundamental wave includes a third harmonic or a fifth harmonic. A harmonic abnormality can be determined from the value (dB) of the power spectrum of the fundamental wave, the third harmonic, and the fifth harmonic of each of the CT sensors 7a to 7f shown in FIG. 2.

The abnormality registration unit 85 registers the detection result data determined by the overload determination unit 81, the imbalance determination unit 82, the loss determination unit 83, and the harmonic determination unit 84 (whether or not there is an abnormality, the type of abnormality, and the degree of abnormality) in the management database 54 along with a relay management code and sensor ID.

The abnormality notification unit 86 notifies the maintenance management center 4 of the detection result data registered by the abnormality registration unit 85.

Maintenance Management Center

The maintenance management center 4 performs maintenance management of the power distribution network 100 on the basis of the notification of the abnormality detection result data from the power management center 5. That is, management such as dispatching a worker to make actual confirmation is performed at the installation location of the CT sensor 7 that has transmitted detection data in which an abnormality has been detected. As shown in FIG. 4, the maintenance management center 4 has a maintenance management device 41 and a display unit 42. As shown in FIG. 4, the maintenance management device 41 has an abnormality receiver 43. The abnormality receiver 43 receives the detection result data transmitted from the abnormality notification unit 86 of the power management device 51. The display unit 42 displays the detection result data, and the manager takes measures such as dispatching a worker to the site if needed.

First Power Management Center and Second Power Management Center

As shown in FIG. 1, the first power management center 2 has a first power management device 21, a management database 22, and a display unit 23. As shown in FIG. 4, the first power management device 21 has a communication unit 24 provided with a receiver 24a and a transmitter 24b, and communicates with the power management center 5 provided in each of the blocks A and B. The first power management device 21 uses the communication unit 24 to receive the detection result data obtained by each power management device 51, and stores the data in the management database 22.

The detection result data includes whether or not there is an abnormality, the type of abnormality, and the warning level of the abnormality, and the detection result data produced by the power management device 51 includes the ID and position of the CT sensor 7 that produced the measurement data in which an abnormality was detected, the measurement time at which measurement data was obtained in which an abnormality was detected, and so forth.

Thus leaving a record of abnormality detection in the management database 22 makes it possible for the host power management centers 2 and 3 to take measures.

The second power management center 3 is configured the same as the first power management center 2, and as shown in FIG. 1, has a second power management device 31 having a communication unit provided with a transmitter and a receiver, a management database 32, and a display unit 33. The second power management center 3 communicates with the power management center 5 provided in block C, and stores detection result data produced by the power management center 5.

Operation

The operation of the power distribution network monitoring system 1 in an embodiment of the present invention will now be described.

Operation of CT Sensor

Figure 5:
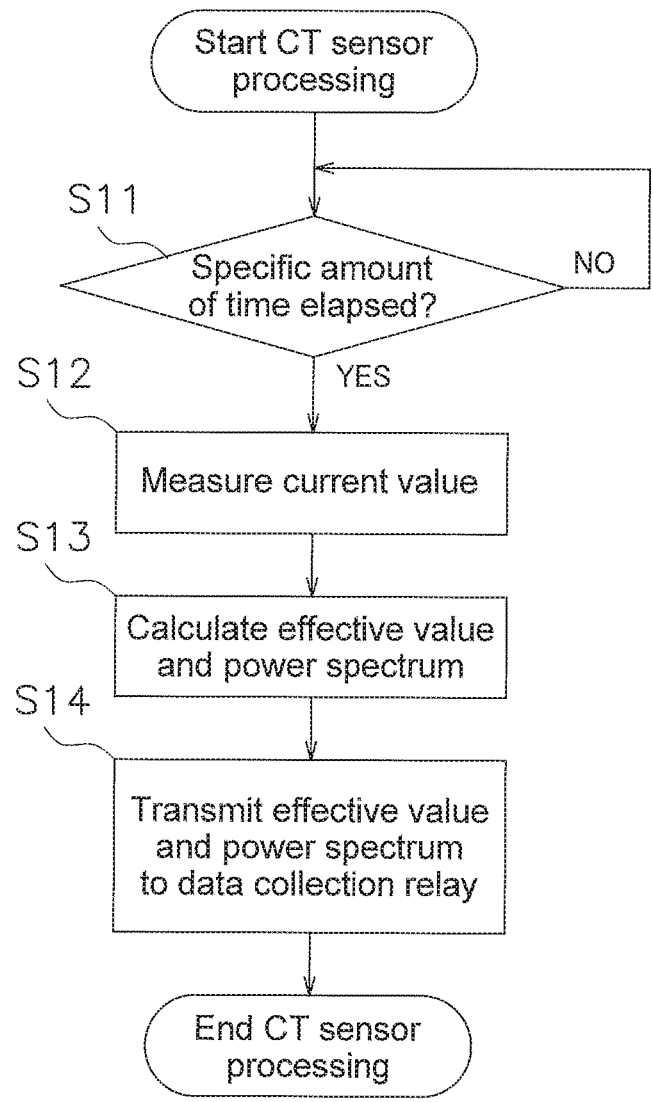
FIG. 5 is a flowchart of the operation of a CT sensor in the power distribution network monitoring system in FIG. 1.

FIG. 5 is a flowchart of the operation of the CT sensor 7 of the power distribution network monitoring system 1 in this embodiment.

When processing commences, once a specific charging time has elapsed in step S11, in step S12 power is supplied from the power supply unit 72 and the measurement component 71 measures the current of the distribution line. The specific charging time can be set, for example, to six minutes, in which case current measurement is performed every six minutes.

Next, in step S13 the measurement component 71 calculates the effective value and the power spectrum. Values are determined for the power spectrum of the fundamental wave, the third harmonic, and the fifth harmonic.

Next, in step S14 the calculated effective current values and the values for the power spectrum of the fundamental wave, the third harmonic, and the fifth harmonic are transmitted from the transmitter 73 to the data collection relay 6, and the processing of the CT sensor 7 ends.

Operation of Data Relay

Figures 6, 7:
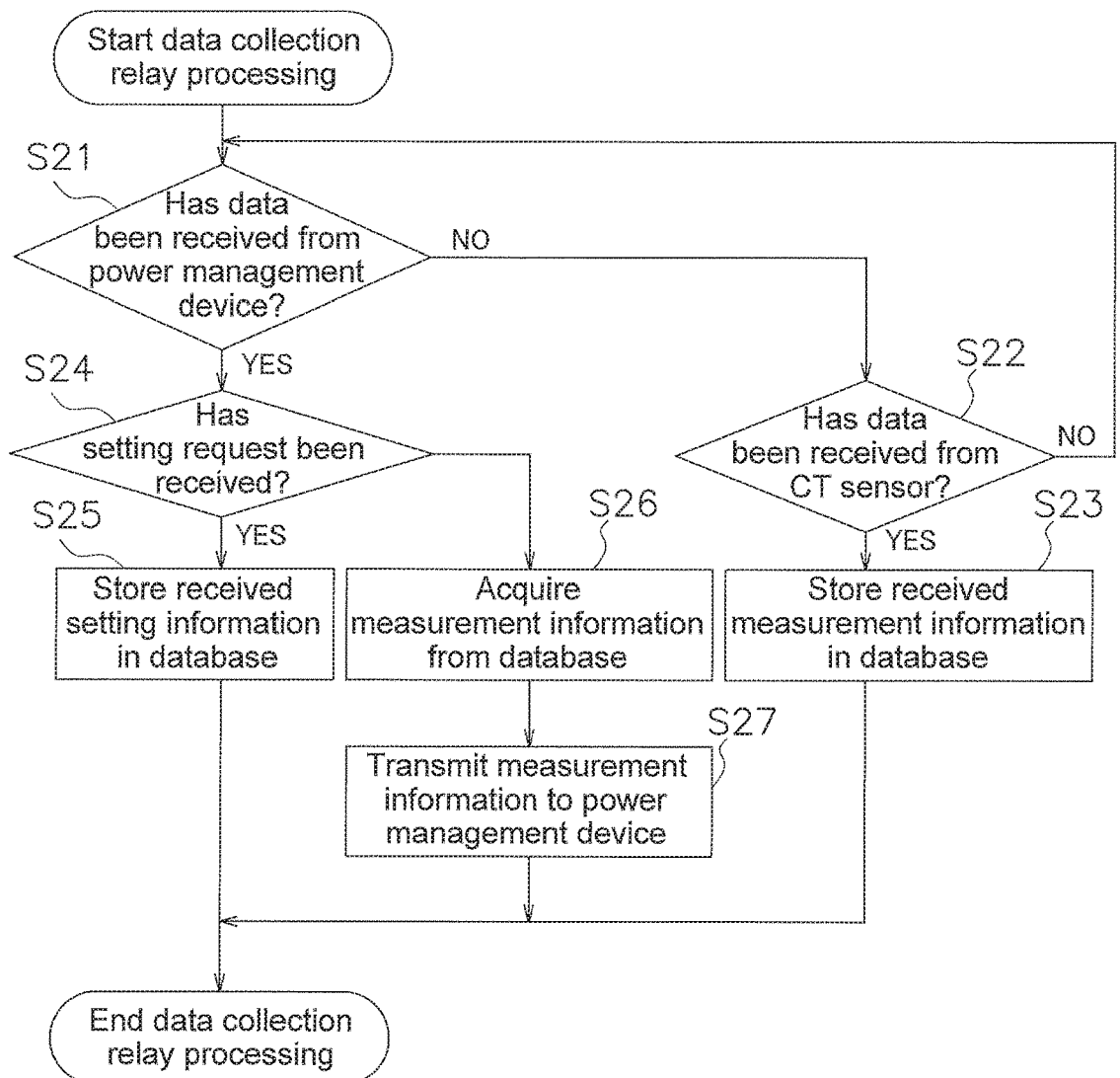
FIG. 6 is a flowchart of the operation of the data collection relay in the power distribution network monitoring system in FIG. 1.
FIG. 7 is a setting information table stored in the management database of the data collection relay in FIG. 3.

FIG. 6 is a flowchart of the operation of the data collection relay 6 of the power distribution network monitoring system 1 in this embodiment.

When the processing commences, in step S21 the data collection relay 6 determines whether or not data has been received from the power management device 51 via the communication unit 63.

If no data has been received from the power management device 51, it is determined in step S22 whether or not data has been received from the CT sensor 7. If data has been received, in step S23 the data collection relay 6 stores the received measurement information in the management database, and the processing of the data collection relay 6 ends.

On the other hand, if data has been received from the power management device 51 in step S21, it is determined in step S24 whether or not a setting request has been received.

If a setting request has been received, in step S25 the received setting request is stored in the management database 62, and the processing of the data collection relay 6 ends.

On the other hand, if no setting request has been received in step S24, then data acquisition request has been transmitted from the power management device 51, so the data collection relay 6 acquires measurement information from the management database 62. Then, in step S27 the data collection relay 6 transmits the measurement information to the power management device 51, and the processing of the data collection relay 6 ends.

Here, the sensor ID, measurement time, and detection data are transmitted from the plurality of CT sensors 7 to the data collection relay 6 at six-minute intervals, for example, and the sensor ID, measurement time, and detection data are stored in association with one another as a database in the management database 62 of the data collection relay 6.

FIG. 7 shows a setting information table 91 stored in the management database 62, and FIG. 8 shows a measurement information table 92 stored in the management database 62. As shown in FIG. 7, the management code (A01_01) of the data collection relay 6, the IDs (001, 002 to 00n) of the CT sensors 7, and time information are recorded in the setting information table 91. The setting information table 91 stores and updates the setting information received from the power management device 51. Also, as shown in FIG. 8, the IDs (01, 002 to 00n) of the CT sensors 7, the measurement time, and detection data of the CT sensors 7 (the effective current values and the power spectrum values (dB) of the fundamental wave, the third harmonic, and the fifth harmonic) are stored in association with each other in the measurement information table 92. Thus, the detection data and the time at which that data was measured are stored for each CT sensor 7. The measurement information table 92 is updated whenever detection data is received from a CT sensor 7.

Operation of Power Management Device

Figure 9:
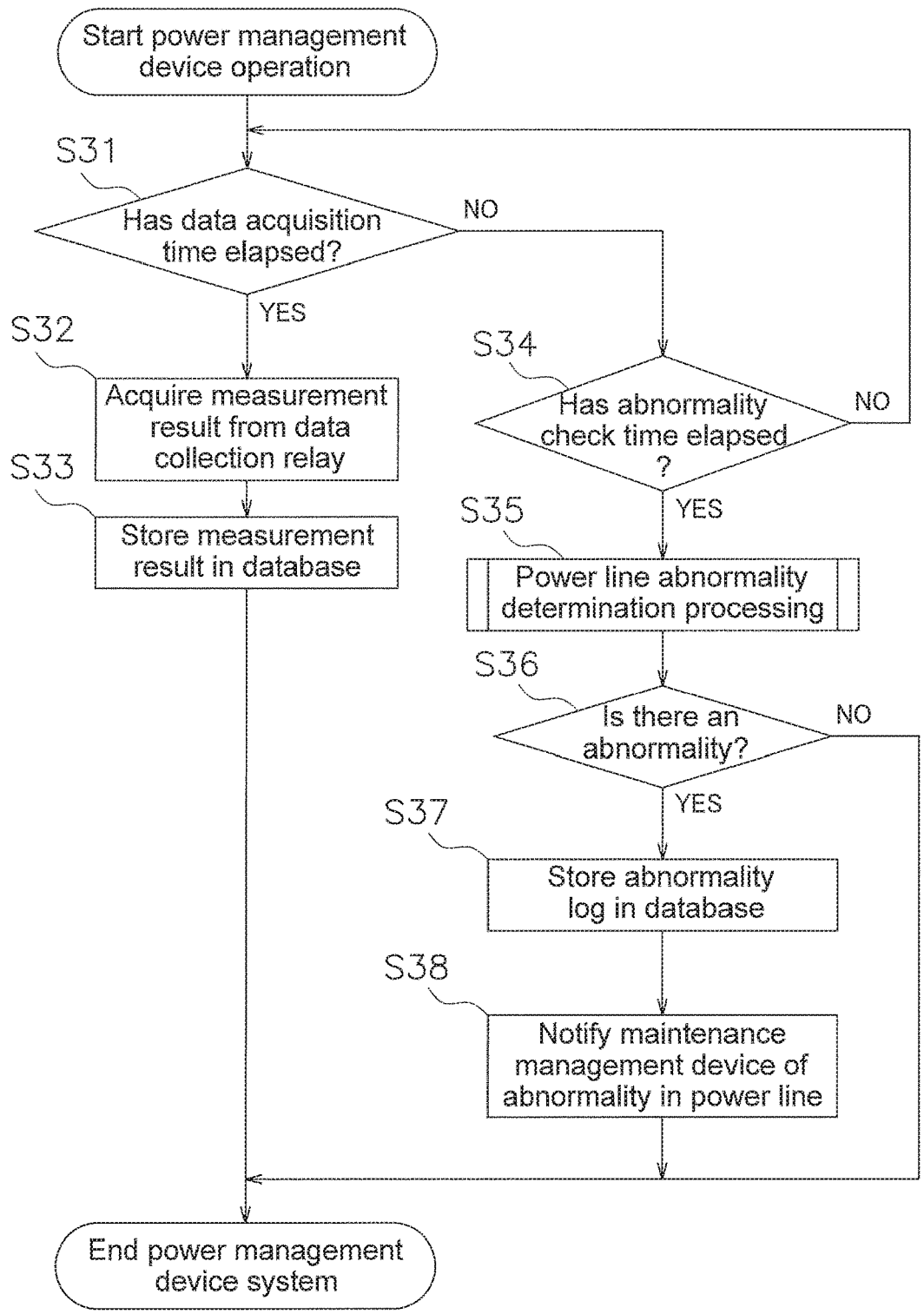
FIG. 9 is a flowchart showing the operation of the power management device of the power distribution network monitoring system in FIG. 1.

FIG. 9 is a flowchart of the operation of the power management device 51 of the power distribution network monitoring system 1 in this embodiment.

In step S31, the power management device 51 determines whether or not a data acquisition time has elapsed. In this embodiment, the data acquisition time is set every 60 minutes, for example.

Since the measurement result from the data collection relay 6 is acquired if 60 minutes have elapsed, in step S32 the power management device 51 transmits a data acquisition request from the transmitter 53b to the data collection relay 6.

Upon wirelessly receiving the data acquisition request from the power management device 51, the data collection relay 6 transmits the measurement information stored in the management database 62 to the power management device 51 via the transmitter 55b.

Upon receiving the measurement information from the data collection relay 6, in step S33 the power management device 51 stores the measurement information in the management database 54. The table stored in the management database 54 will now be described.

FIG. 10 shows a setting information table 93 stored in the management database 54, and FIG. 11 shows a measurement information table 94 stored in the management database 54. FIG. 12 shows a position information management table 95 stored in the management database 54.

As shown in FIG. 10, area codes (such as the areas A-1, A-2, etc., in FIG. 1), the management code (A01_01) of the data collection relay 6, the group ID, the classification ID, the ID of the CT sensors 7 (001, 002 to 00n), and time information are recorded in the setting information table 93. Here, the group ID indicates the type of trunk line on which a CT sensor 7 is installed, and indicates whether it is installed on a distribution line of R phase, S phase, or T phase. The classification ID indicates whether a CT sensor 7 is installed on a trunk line or a branch line, with BR00 indicating that the CT sensor 7 is installed on a trunk line, and BR01 that it is installed on a branch line.

The power distribution network 100 shown in FIG. 2 will be described as an example. The power distribution network 100 shown in FIG. 2 is provided in the area A01, the management code of the data collection relay 6a is A01_01, and the management code of the data collection relay 6b is A01_02. In this case, since the CT sensor 7a, whose sensor ID is 001, is installed on the R-phase distribution line 103, the group ID is set to R and the distribution line 103 is a trunk line, so the classification ID is set to BR00. Also, since the CT sensor 7d, whose sensor ID is 002, is installed on the R-phase distribution line 103, the group ID is set to R, and since the distribution line 103 is a trunk line, the classification ID is set to BR00. Also, since the CT sensor 7g, whose sensor ID is 00n, is installed on the distribution line 106, which is a branch line of the T-phase distribution line 105, the group ID is T, and since the distribution line 106 is a branch line, the ID is set to BR01.

As shown in FIG. 11, the area code, the relay management code, the ID of each CT sensor 7 (001, 002, . . . , 00n), time information indicating the measurement time, and detection data for each CT sensor 7 (the effective value of the current and the value (dB) of the power spectrum of the fundamental wave, the third harmonic, and the fifth harmonic) are stored in association with each other in the measurement information table 94.

As shown in FIG. 12, position information about the CT sensors 7 installed in the area code is managed in the position information management table 95. The area code, the relay unit management code, the CT sensor ID, and the position code are stored in association with each other in the position information management table 95. The position code can be used to confirm the location at which the corresponding CT sensor 7 is installed.

The setting information table 93 stores and updates setting information set by the power management device 51. Also, the measurement information table 94 is updated when measurement data is received from a data collection relay 6. The position information management table 95 is updated when a new CT sensor 7 is installed or when the installation location of a CT sensor 7 is changed.

If the data acquisition time has not elapsed in step S31 described above, in step S34 the power management device 51 confirms whether or not an abnormality check time has passed. The interval of this abnormality check can be set to 60 minutes, for example.

If the abnormality check time has passed, in step S35 abnormality determination processing is performed on the distribution line. The abnormality determination processing of the distribution line will be described in detail below. If the abnormality check time has not passed, the processing goes back to step S31.

Next, in step S36 it is determined whether or not there is an abnormality. If there is no abnormality, the operation of the power management device 51 ends.

On the other hand, if there is an abnormality, an abnormality log is recorded in the management database 54 in step S37. FIG. 13 is a diagram of an abnormality management table 96, which is an abnormality log recorded in the management database. In the abnormality management table 96, an area code (A01), relay management codes (A01_01 to A01_0n, A02_01, . . . ), CT sensor IDs (001, . . . ), and states are recorded. The "state" indicates the type of abnormality, such as overload, imbalance, loss, or harmonic, and normal or abnormal, and in the case of abnormality, the warning level is indicated in three stages.

Next, in step S38 the abnormality notification unit 86 of the power management device 51 notifies the abnormality receiver 43 of the maintenance management device 41 that there is an abnormality of the distribution line, and the processing of the power management device ends.

The abnormality determination processing performed for the distribution line in step S35 will now be described.

Abnormality Determination Processing for Distribution Line

Figure 14:
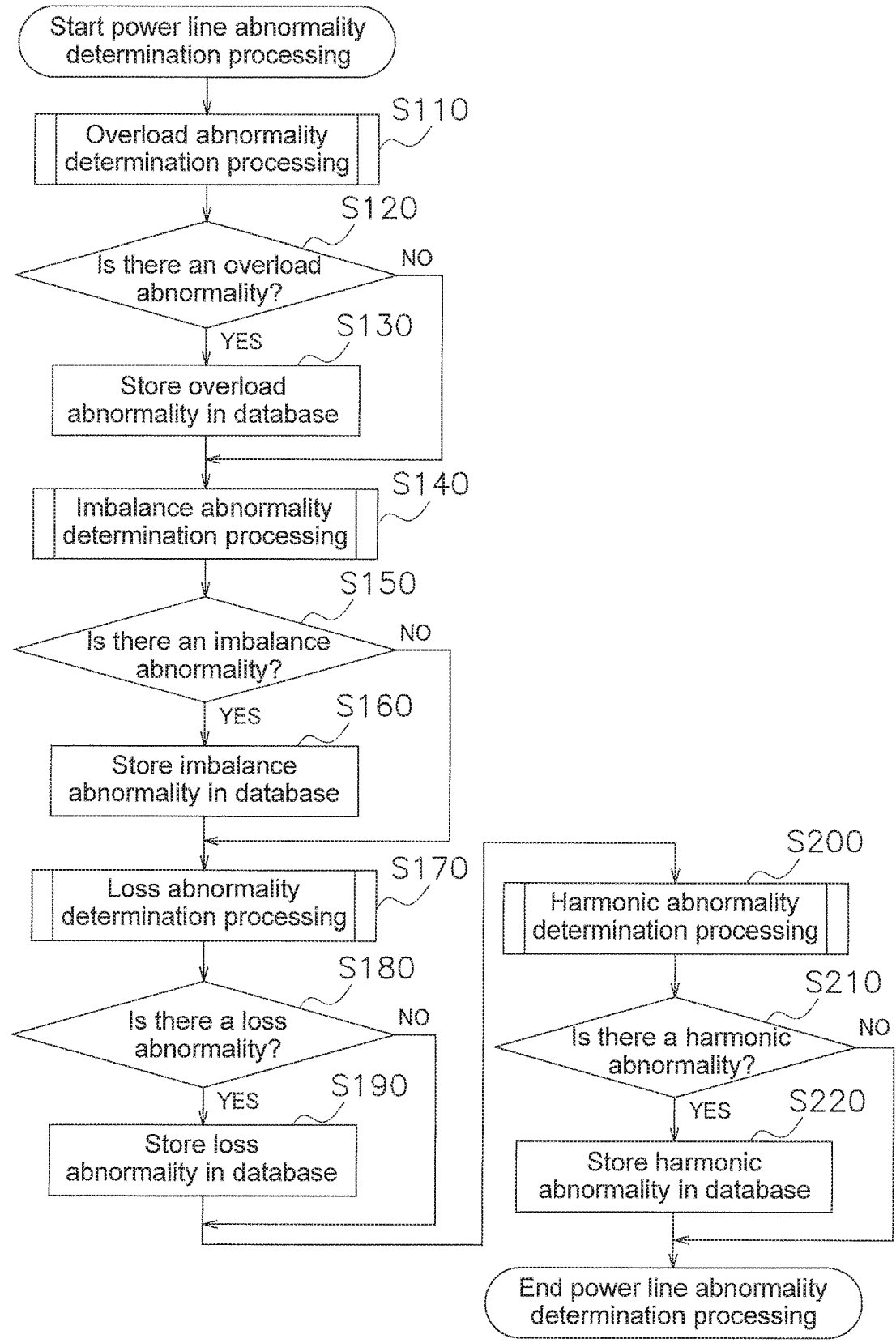
FIG. 14 is a flowchart of abnormality determination processing for a distribution line performed by the power management device in FIG. 3.

FIG. 14 is a flowchart of abnormality determination processing for a distribution line.

First, in step S110 the overload determination unit 81 of the abnormality determination unit 56 performs overload abnormality determination processing. If an overload abnormality is determined in step S120, the abnormality registration unit 85 registers the overload abnormality and stores the overload abnormality in the management database 54 in step S130. On the other hand, if no overload abnormality is determined in step S120, the processing proceeds to step S140.

After the storage of an overload abnormality, or if there is no determination of an overload abnormality, in step S140 the imbalance determination unit 82 of the abnormality determination unit 56 performs imbalance abnormality determination processing. If it is determined in step S150 that there is an imbalance abnormality, in step S160 the abnormality registration unit 85 registers the imbalance abnormality and stores it in the management database 54. On the other hand, if there is no determination of imbalance abnormality in step S150, the processing proceeds to step S170.

After the storage of an imbalance abnormality, or if there is no determination of an imbalance abnormality, in step S170 the loss determination unit 83 of the abnormality determination unit 56 performs loss abnormality determination processing. If it is determined in step S180 that there is a loss abnormality, in step S190 the abnormality registration unit 85 registers the loss abnormality and stores it in the management database 54. On the other hand, if no loss abnormality is determined in step S180, the processing proceeds to step S200.

After the storage of a loss abnormality, or if there is no determination of a loss abnormality, in step S200 the harmonic determination unit 84 of the abnormality determination unit 56 performs harmonic abnormality determination processing. If it is determined in step S210 that there is a harmonic abnormality, in step S220 the abnormality registration unit 85 registers the harmonic abnormality and stores it in the management database 54, and the abnormality determination processing ends. On the other hand, the abnormality determination process also ends when there is no determination of loss abnormality in step S210.

The above-mentioned overload abnormality determination processing, imbalance abnormality determination processing, loss abnormality determination processing, and harmonic abnormality determination processing can be performed in any order.

Each abnormality determination process will be described below.

Overload Abnormality Determination Processing

Figure 15:
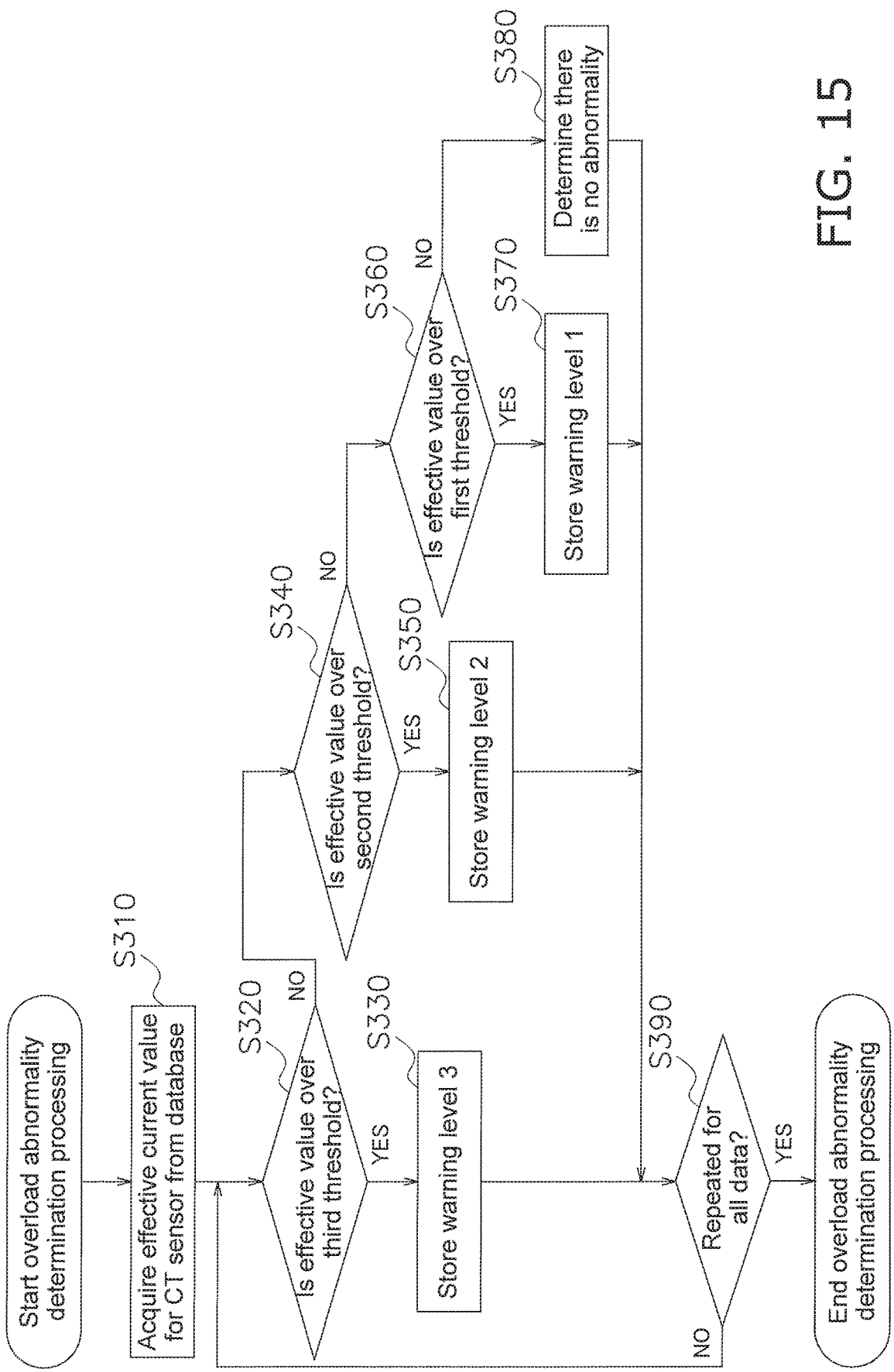
FIG. 15 is a flowchart of overload abnormality determination processing in the abnormality determination processing in FIG. 14.

FIG. 15 is a flowchart of the overload abnormality determination process in step S110 in FIG. 14.

In step S310, the overload determination unit 81 of the abnormality determination unit 56 acquires the effective current value of the CT sensor 7 from the management database 54. The effective current value is stored in the measurement information table 94.

Figure 16:
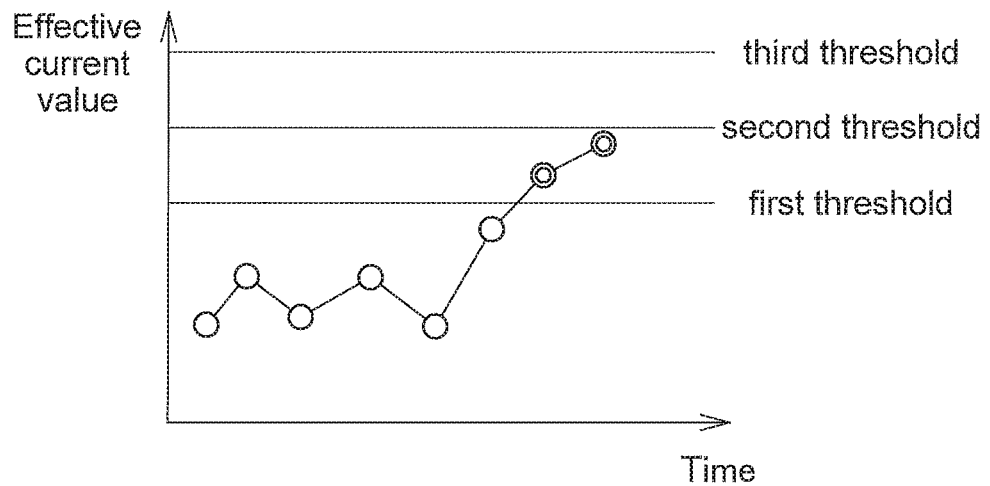
FIG. 16 is a graph of the change over time in the effective current value.

Next, in step S320 the overload determination unit 81 determines whether or not the acquired effective current value is over a third threshold. Here, first, second, and third thresholds that have been preset are stored in the management database 54. FIG. 16 is a graph of the change in effective current value over time, and shows the first threshold, second threshold, and third threshold. The values are set to increase in the order of the first threshold, the second threshold, and the third threshold, which allows the warning level of the abnormality to be set in stages. The first threshold, the second threshold, and the third threshold are all set to a value that is greater than the allowable current range for the distribution line at the installation location of the CT sensor 7 from which the data was acquired. The more the value is above allowable current range, the more severe is the extend of the overload abnormality determined, and the warning level is raised.

In step S320, if the overload determination unit 81 determines that the acquired effective current value is over the third threshold, in step S330 the abnormality registration unit 85 stores that the warning level is 3.

Also, in step S320, if the effective current value is not over the third threshold, the overload determination unit 81 determines in step S340 whether or not the effective current value is over the second threshold.

In step S340, if it is determined by the overload determination unit 81 that the acquired effective current value is over the second threshold, in step S350 the abnormality registration unit 85 stores that the warning level is 2.

Also, in step S340, if the effective current value is not over the second threshold, in step S360 the overload determination unit 81 determines whether or not the effective current value is over the first threshold.

In step S360, if it is determined by the overload determination unit 81 that the acquired effective current value is over the first threshold, in step S370 the abnormality registration unit 85 stores that the caution level is 1.

Also, in step S360, if the effective current value is not over the first threshold value, the overload determination unit 81 determines that there is no abnormality.

After the above steps S330, S350, S370, and S380, the processing proceeds to step S390, and steps S310 to S380 are repeated until overload abnormality determination is performed for all the acquired data.

For example, if measurement information is transmitted every six minutes from one CT sensor 7 to the data collection relay 6, measurement information is transmitted every 60 minutes from the data collection relay 6 to the power management device 51, and abnormality determination is performed every 60 minutes, abnormality determination is performed for the data of the effective current value for 60 minutes for one CT sensor 7. Also, a plurality of sets of measurement information about all the CT sensors 7 in block A are transmitted to the power management device 51. Once steps S310 to S380 have been repeated for all the data, the overload abnormality determination processing ends.

Also, as shown in FIG. 16, it is possible to acquire the change in the effective current value in a specific length of time for one CT sensor 7. If the change in the effective current value is over the threshold value, the abnormality registration unit 85 stores time information, the type of abnormality, and the warning level in the management database 54 in step S130. In FIG. 16, the effective current value at the points indicated by a double circle is over the first threshold.

If the allowable level of the power line varies with the installation location of the CT sensor 7, the value of the threshold may be changed on the basis of the sensor ID of the CT sensor 7.

Imbalance Abnormality Determination Processing

Figure 17A:
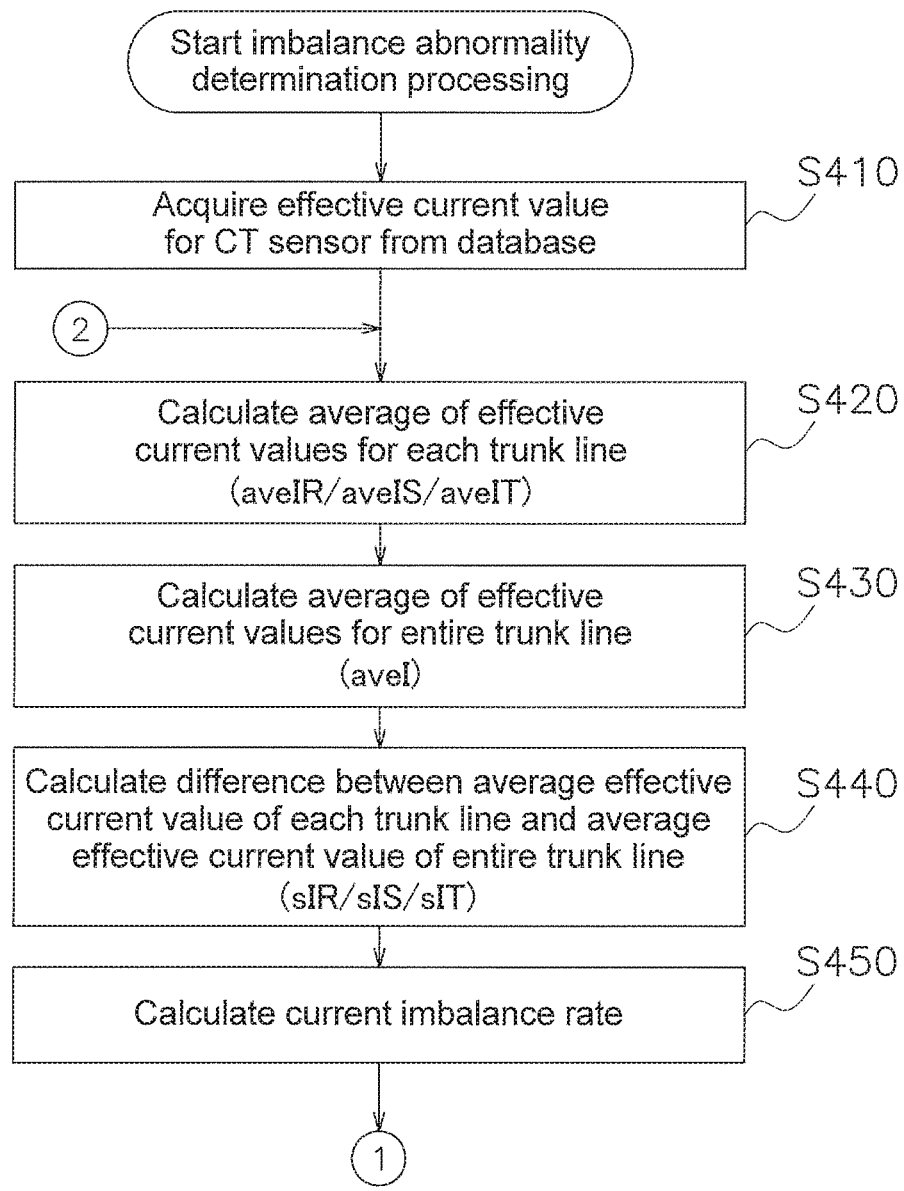
FIG. 17A is a flowchart of imbalance abnormality determination processing in the abnormality determination processing in FIG. 14.
Figure 17B:
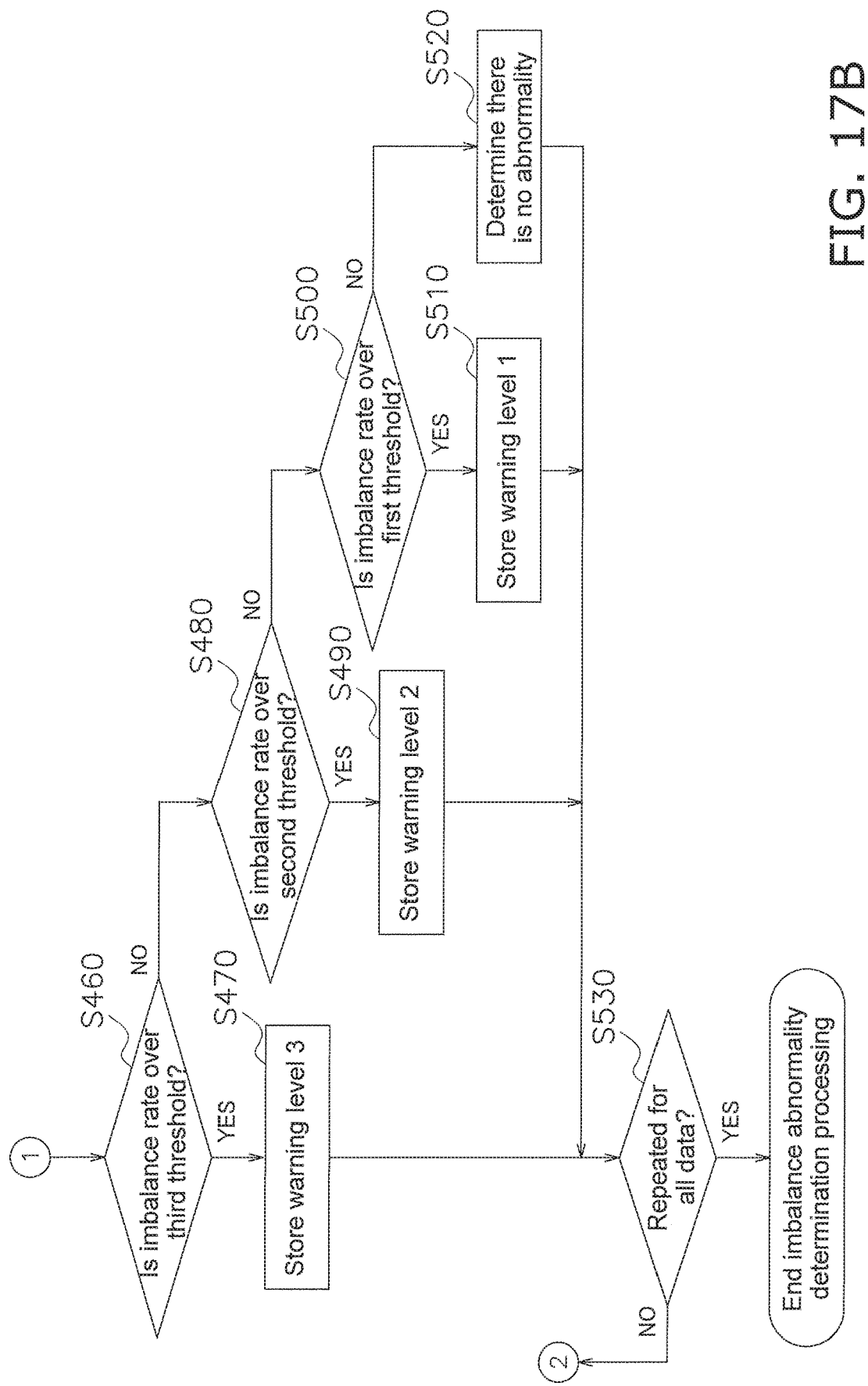
FIG. 17B is a flowchart of imbalance abnormality determination processing in the abnormality determination processing in FIG. 14.

FIGS. 17A and 17B are flowcharts of the imbalance abnormality determination processing of step S140 in FIG. 14.

In step S410, the imbalance determination unit 82 of the abnormality determination unit 56 acquires the effective current value of the CT sensor 7 from the management database 54. The effective current value is stored in the measurement information table 94. Here, in order to perform imbalance abnormality determination, the abnormality determination unit 56 acquires effective current values for the three CT sensors 7 installed in the three phases of the trunk line. The CT sensors 7a, 7b, and 7c in FIG. 2 are an example of this.

Next, in step S420 the imbalance determination unit 82 calculates the average of the effective current values of each trunk line. Here, for example, if measurement information is transmitted every six minutes from one CT sensor 7 to the data collection relay 6, measurement information is transmitted every 60 minutes from the data collection relay 6 to the power management device 51, and abnormality determination is performed every 60 minutes, the average of ten effective current values in 60 minutes is found for each of the CT sensors 7a, 7b, and 7c.

Since the CT sensor 7a is installed on the R-phase trunk line, the average (aveIR) of the R-phase effective current values can be found by calculating the average of the effective current values of the CT sensor 7a. Since the CT sensor 7b is installed on the S-phase trunk line, the average (aveIS) of the S-phase effective current values can be found by calculating the average of the effective current values of the CT sensor 7b. Since the CT sensor 7c is installed on the T-phase trunk line, the average (aveIT) of the T-phase effective current values can be found by calculating the average of the effective current values of the CT sensor 7c.

Next, in step S430 the imbalance determination unit 82 calculates the average (aveI) of the effective current values for the entire trunk line. The average of the effective current values of the entire trunk line is an average of the average values of the effective current values of the three phases of trunk line, and thus can be obtained by the following Formula 1.

$$aveI=(aveIR+aveIS+aveIT)\div 3 \qquad \text{Formula 1}$$

Next, in step S440 the imbalance determination unit 82 calculates the difference (sIR, sIS, sIT) between the average effective current value (aveIR, aveIS, aveIT) of each trunk line and the average effective current value (aveI) of the entire trunk line. That is, the difference (sIR) between the average effective current value of the R phase (aveIR) and the average effective current value of the entire trunk line (aveI), the difference (sIS) between the average effective current value of the S phase (aveIS) and the average effective current value of the entire trunk line (aveI), and the difference (sIT) between the average effective current value of the T phase (aveIT) and the average effective current value of the entire trunk line (aveI) can be found from the following Formulas 2 to 4.

$$sIR=|aveIR-aveI| \qquad \text{Formula 2}$$

$$sIS=|aveIS-aveI| \qquad \text{Formula 3}$$

$$sIT=|aveIT-aveI| \qquad \text{Formula 4}$$

Next, in step S450 the imbalance determination unit 82 calculates the current imbalance rate. The current imbalance rate is the ratio of the difference between the average effective current value of the trunk line that diverges most from the average effective current value of the entire trunk line and the average effective current value of the entire trunk line, to the average effective current value of the entire trunk line. The current imbalance rate (incong_rate) can be obtained from the following Formula 5.

$$\text{incong\_rate} = \text{MAX}(sIR/sIS/sIT)/\text{aveI} \times 100(\%) \quad \text{Formula 5}$$

Next, in step S460 the imbalance determination unit 82 determines whether or not the calculated current imbalance rate is over a third threshold. Here, the management database 54 stores first, second, and third thresholds that have been preset. The values are set to increase in the order of the first threshold, the second threshold, and the third threshold, and the warning level increases in order.

If the imbalance determination unit 82 determines in step S460 that the calculated current imbalance rate is over the third threshold, in step S470 the abnormality registration unit 85 stores that the warning level is 3.

If the current imbalance ratio is not over the third threshold in step S460, the imbalance determination unit 82 determines in step S480 whether or not the current imbalance ratio is over the second threshold.

If it is determined by the imbalance determination unit 82 in step S480 that the calculated current imbalance ratio is over the second threshold, in step S490 the abnormality registration unit 85 stores that the warning level is 2.

If the current imbalance rate is not over the second threshold in step S480, the imbalance determination unit 82 determines in step S500 whether or not the current imbalance rate is over the first threshold.

If it is determined by the imbalance determination unit 82 in step S500 that the current imbalance ratio is over the first threshold, in step S510 the abnormality registration unit 85 stores that the warning level is 1.

If the current imbalance ratio is not over the first threshold in step S500, the imbalance determination unit 82 determines in step S520 that there is no abnormality.

After the above steps S470, S490, S510, and S520, the processing proceeds to step S530. Steps S420 to S520 are repeated until a determination of imbalance abnormality has been performed for all the acquired data. When steps S420 to S520 have been repeated for all the acquired data, the imbalance abnormality determination processing ends.

Figure 18:
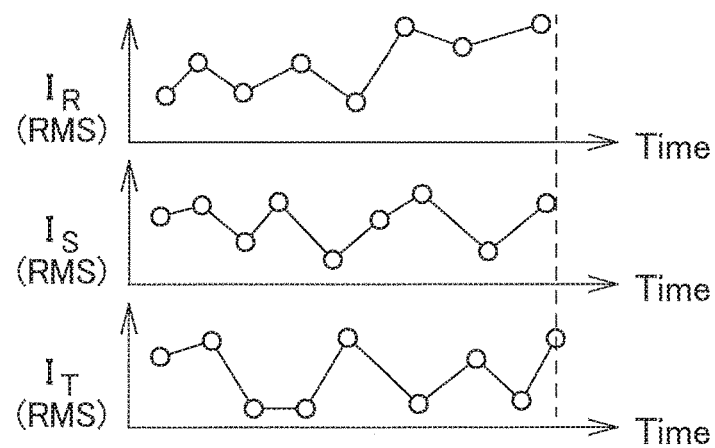
FIG. 18 is a graph of the change over time in the effective current value in each trunk line.

FIG. 18 is a graph of the change in the effective current value in each trunk line. As shown in FIG. 18, the imbalance determination unit 82 acquires the effective current values of the three CT sensors 7a, 7b, and 7c. Because it is difficult to compare the waveforms of the R-phase, T-phase, and S-phase currents at the same timing, the imbalance rate is calculated using the average effective current value over a fixed period as described above.

Figure 19:
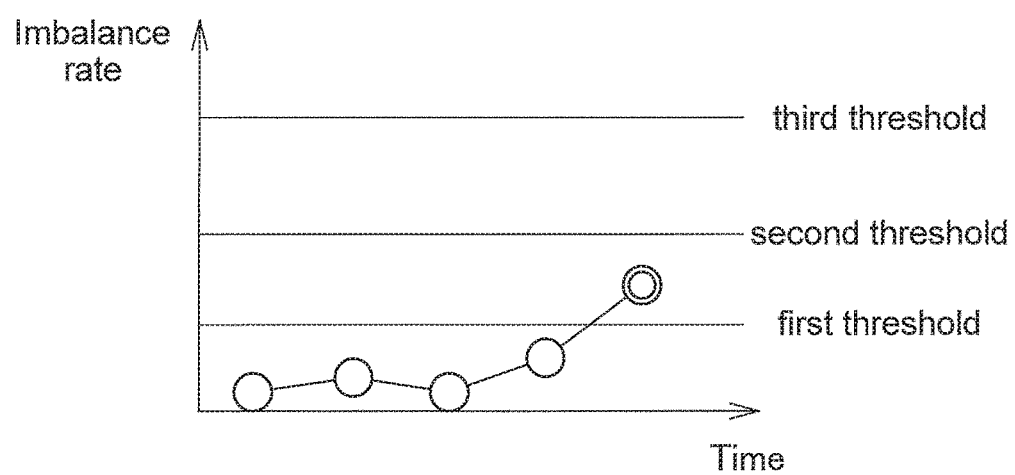
FIG. 19 is a graph of the change over time in the imbalance rate.

FIG. 19 is a graph of the change over time in the imbalance rate. The data indicated by the double circle in the graph is understood to be warning level 1 because it lies between the first threshold and the second threshold.

Loss Abnormality Determination Processing

Figure 20A:
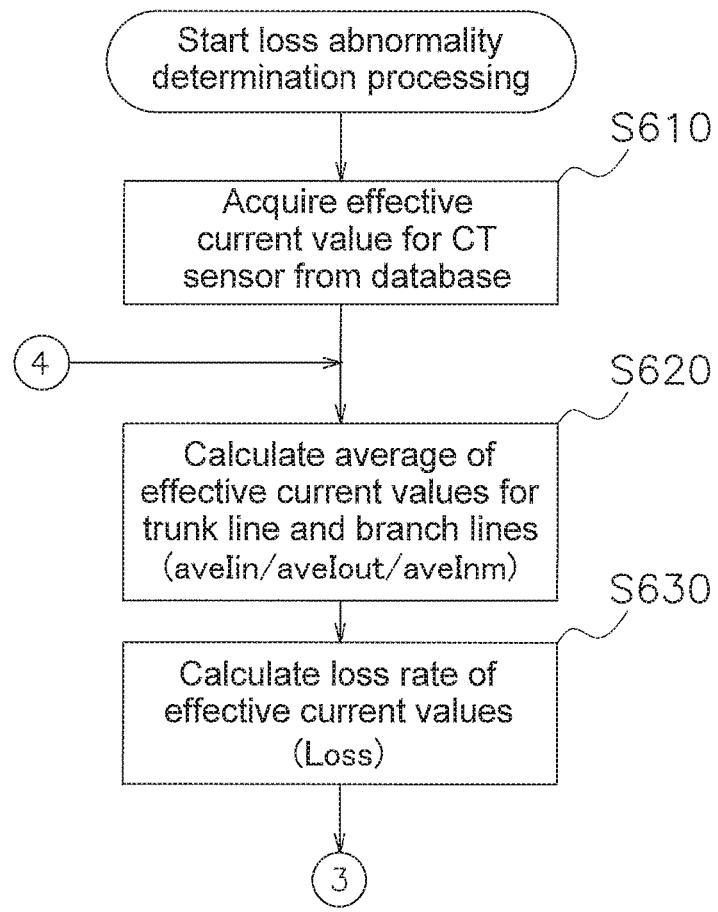
FIG. 20A is a flowchart of loss abnormality determination processing in the abnormality determination processing in FIG. 14.
Figure 20B:
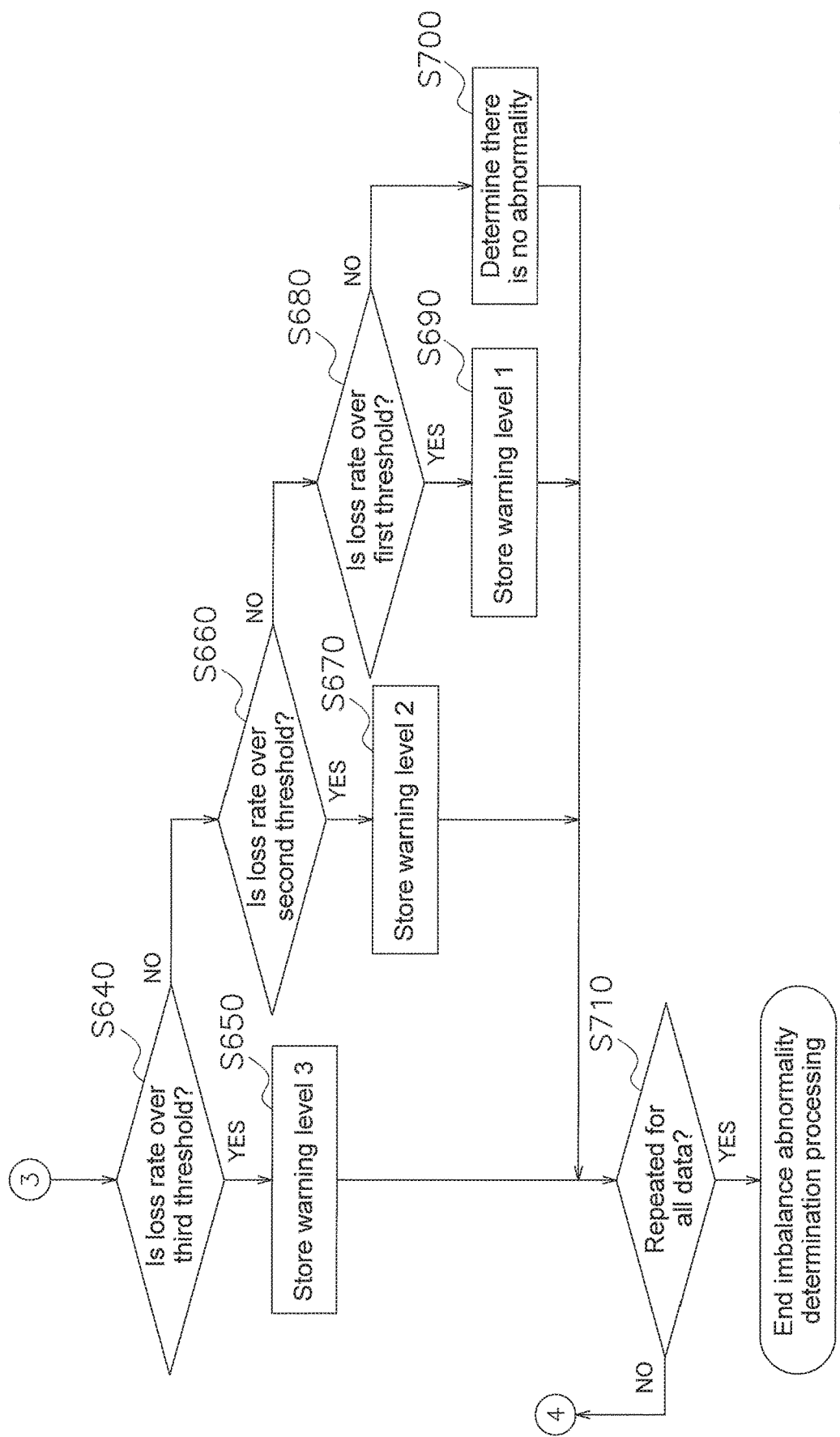
FIG. 20B is a flowchart of loss abnormality determination processing in the abnormality determination processing in FIG. 14.
Figure 21:
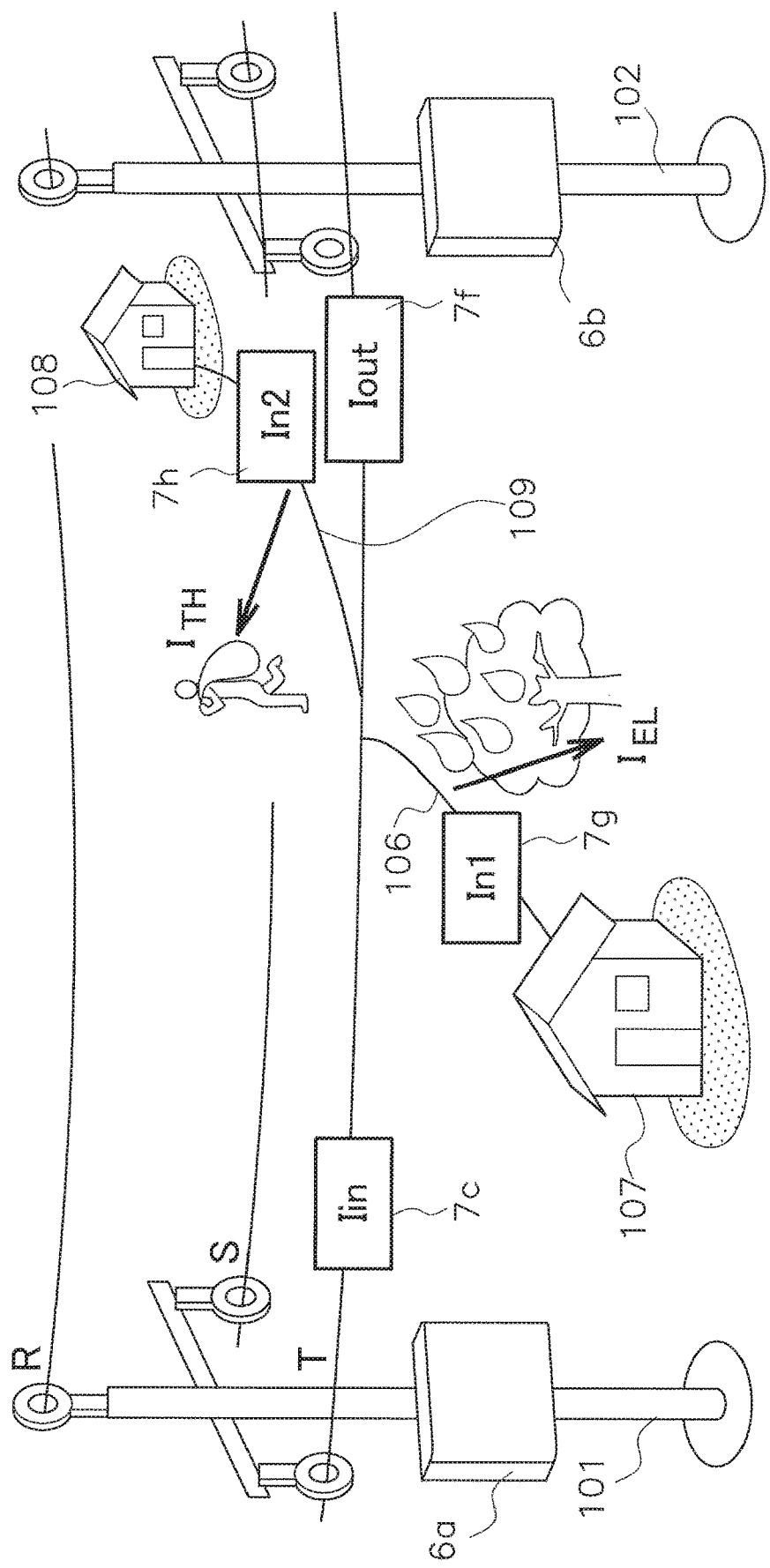
FIG. 21 shows a simulation example of loss abnormality.

FIGS. 20A and 20B are flowcharts of the loss abnormality determination processing of step S170 in FIG. 14. FIG. 21 shows a simulation example of loss abnormality.

First, in step S610 the loss determination unit 83 of the abnormality determination unit 56 acquires the effective current values of the CT sensors 7 from the management database 54. The effective current values are stored in the measurement information table 94. Here, in order to perform the loss abnormality determination, the abnormality determination unit 56 acquires, for example, the effective current values of the CT sensors installed on the entrance and exit sides of each trunk line and on branch lines therebetween.

This will be described by using FIG. 21 as an example. In FIG. 21, only the T-phase distribution line 105 is shown of the three phases, a house 108 is added to what is shown in FIG. 2, and a distribution line 109, which is a branch line, branches off from the distribution line 105 toward the house 108. Also, a CT sensor 7h is installed near the house 108 on the distribution line 109. For example, in FIG. 21, the loss abnormality on the distribution lines 105, 106, and 109 between the power pole 101 and the power pole 102 is determined. In this case, the abnormality determination unit 56 acquires the effective current values of the CT sensors 7c, 7f, 7g, and 7h from the management database 54. In the example in FIG. 21, the effective value of the CT sensor 7c corresponds to the effective value on the entrance side of the distribution line 105, which is a trunk line, and the effective value of the CT sensor 7f corresponds to the effective value on the exit side of the distribution line 105, which is a trunk line. Also, the CT sensors 7g and 7h correspond to the effective current values of the CT sensors attached to the branch lines between the entrance and exit of the trunk line.

Next, in step S620 the loss determination unit 83 uses the following Formulas 6 to 8 to calculate the average of the effective current values at the entrance of the trunk line (aveIin), the average of the effective current values at the exit of the trunk line (aveIout), and the average of the effective current values in all the trunk lines (aveInm).

$$\text{aveIin} = \Sigma(\text{Iin})/n \quad \text{Formula 6}$$

$$\text{aveIout} = \Sigma(\text{Iout})/n \quad \text{Formula 7}$$

$$\text{aveInm} = \Sigma(\text{In})/n \quad \text{Formula 8}$$

Here, n is the number of effective values, and m is the number of branch lines.

For example, if measurement information is transmitted from the CT sensor 7 to the data collection relay 6 every six minutes, measurement information is transmitted from the data collection relay 6 to the power management device 51 every 60 minutes, and abnormality determination is performed every 60 minutes, the average of ten effective current values in a 60-minute period is found for each of the CT sensors 7.

An example will be given using FIG. 21. aveIin is calculated from the average of ten (corresponds to n) effective current values of the CT sensor 7c. aveIout is calculated from the average of ten effective current values of the CT sensor 7f. In FIG. 21, since there are two (corresponds to m) branch lines of the distribution lines 106 and 109, aveIn1 is calculated from the average of ten effective current values of the CT sensors 7g. aveIn2 is calculated from the average values of ten effective current values of the CT sensor 7h.

Next, in step S630 the loss determination unit 83 calculates the loss rate of the effective current values. The loss rate (Loss) is the ratio of the remainder obtained by subtracting the sum of the average effective values of the branch lines from the difference between the average effective value at the entrance of the trunk and the average effective value at the exit of the trunk, to the difference between the average effective value at the entrance of the trunk and the average effective value at the exit of the trunk, and can be calculated from the following Formula 9.

$$\text{Loss} = (\text{aveIin} - \text{aveIout} - \Sigma\text{aveInm}) \div (\text{aveIin} - \text{aveIout}) \times 100(\%) \quad \text{Formula 9}$$

ΣaveInm represents the sum of the averages of the effective current values for all the branch lines, and is aveIn1+aveIn2 when described using FIG. 21. ΣaveInm indicates the usage fee. aveIin−aveIout indicates the reduction from the entrance to the exit. Here, the "remainder obtained by subtracting the sum of the average effective values of the branch lines from the difference between the average effective value at the entrance of the trunk and the average effective value at the exit of the trunk" indicates the amount of loss. For example, as shown in FIG. 21, in a case in which leakage of $I_{EL}$ occurs and there is theft of $I_{TH}$, $I_{EL}+I_{TH}$=aveIin−aveIout−ΣaveInm.

Next, in step S640 the loss determination unit 83 determines whether or not the calculated loss rate is over a third threshold. Here, the management database 54 stores first, second, and third thresholds that have been preset. The values are set to increase in the order of the first threshold, the second threshold, and the third threshold, and the warning level increases in order.

If the loss determination unit 83 determines that the calculated loss rate is over the third threshold in step S640, the abnormality registration unit 85 stores that the warning level is 3 in step S650.

In step S640, if the loss rate is not over the third threshold, the loss determination unit 83 determines in step S660 whether or not the loss rate is over the second threshold.

In step S660, if it is determined by the loss determination unit 83 that the calculated loss rate is over the second threshold, in step S670 the abnormality registration unit 85 stores that the warning level is 2.

In step S660, if the loss rate is not over the second threshold, the loss determination unit 83 determines in step S680 whether or not the loss rate is over the first threshold.

In step S680, if it is determined by the loss determination unit 83 that the acquired loss value is over the first threshold, in step S690 the abnormality registration unit 85 stores that the warning level is 1.

In step S680, if the loss rate is not over the first threshold value, in step S700 the loss determination unit 83 determines that there is no abnormality.

After the above steps S650, S670, S690, and S700, the processing proceeds to step S710. Steps S610 to S700 are repeated until determination of abnormality has been performed for all the data acquired in order to determine loss abnormality.

Figure 22:
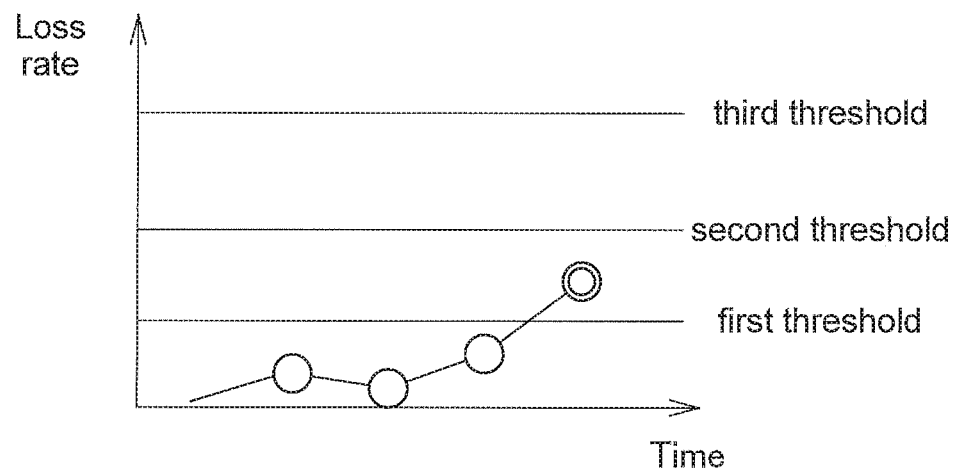
FIG. 22 is a graph of the change over time in the loss rate.

FIG. 22 is a graph of the change over time in the loss rate. The data indicated by a double circle in the graph is understood to be warning level 1 because it lies between the first threshold and the second threshold.

Harmonic Abnormality Determination Processing

Figure 23:
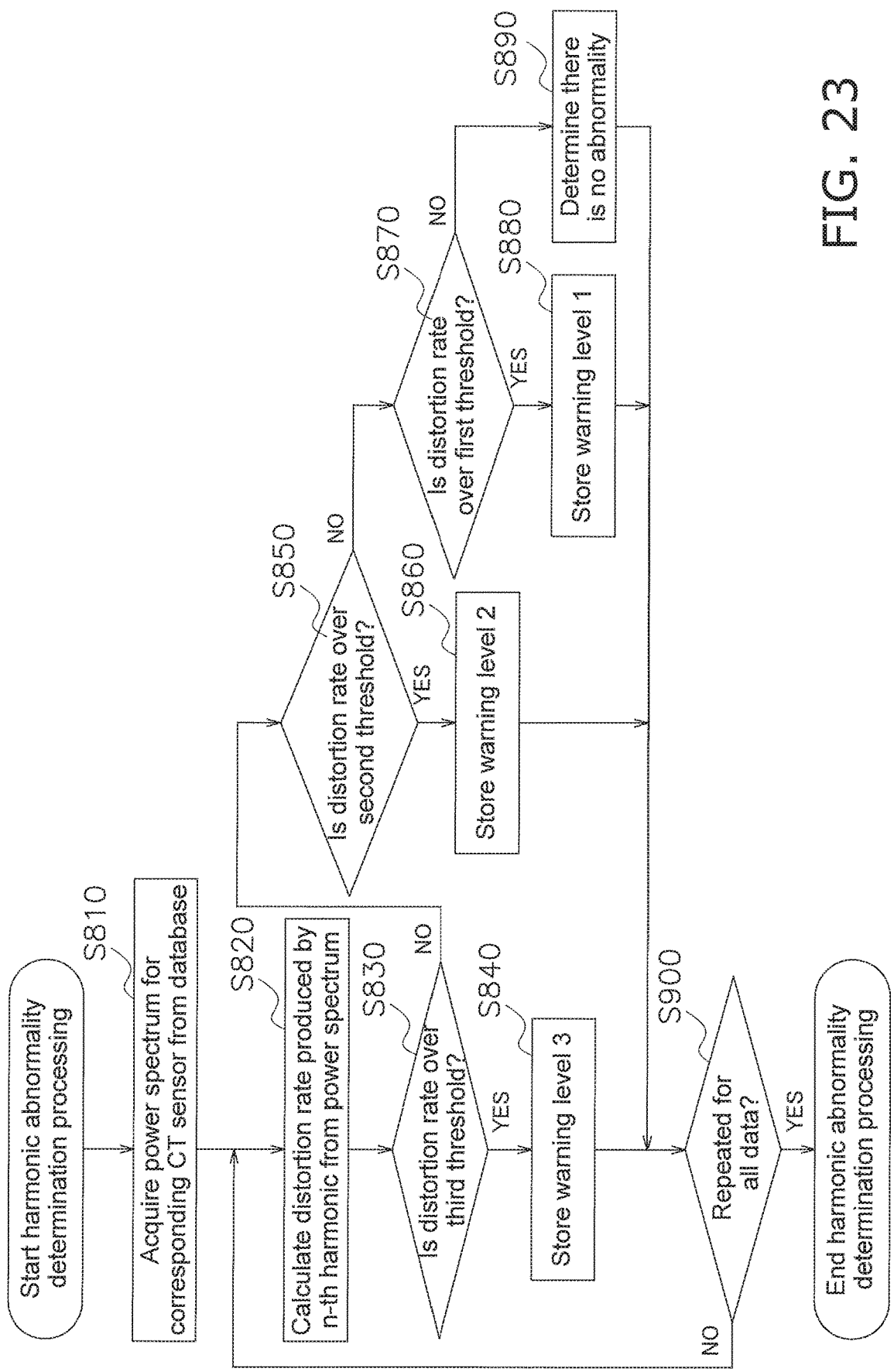
FIG. 23 is a flowchart of harmonic abnormality determination processing in the abnormality determination processing in FIG. 14.

FIG. 23 is a flowchart of the harmonic abnormality determination processing of step S200 in FIG. 14.

Figure 24:
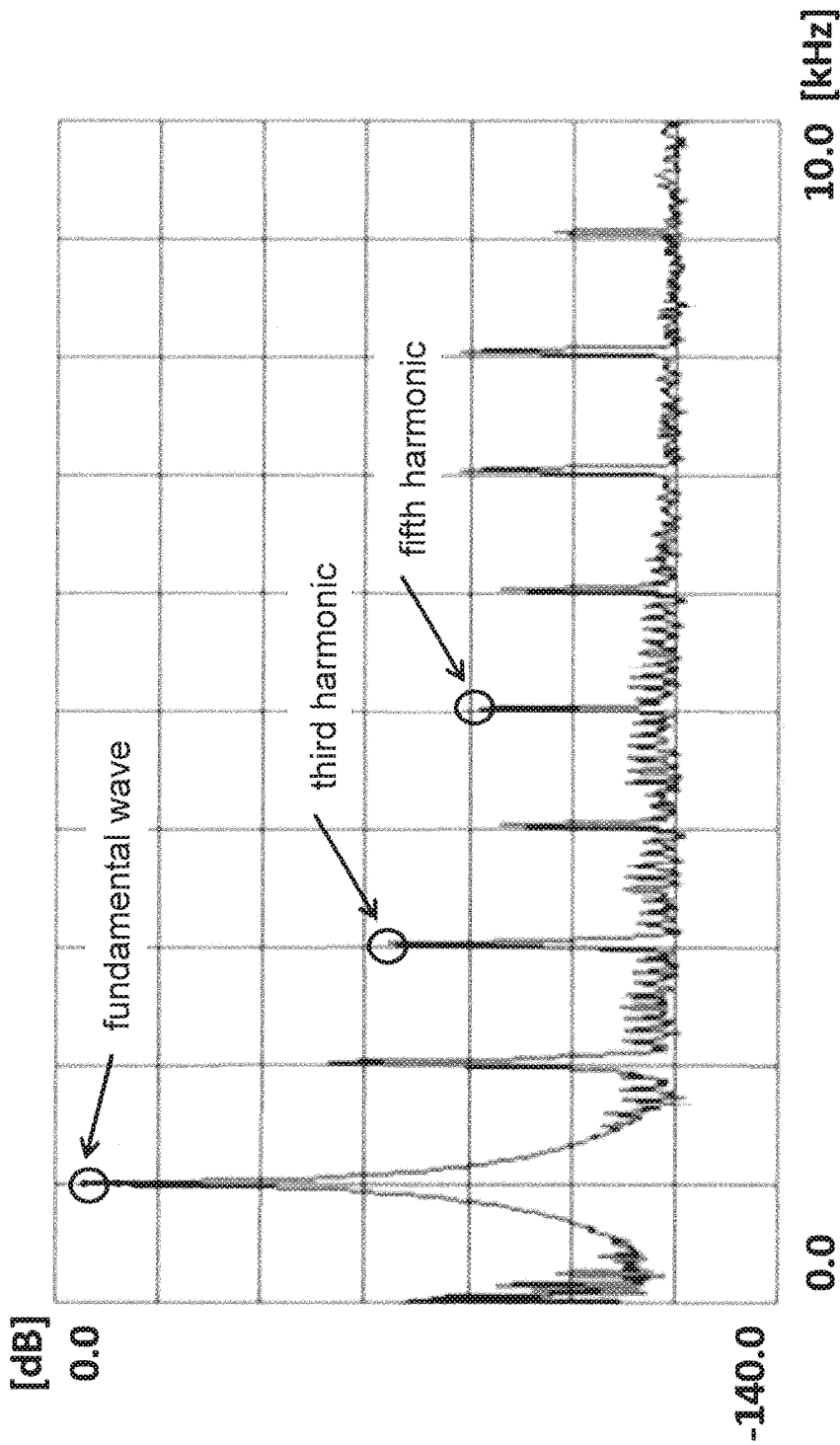
FIG. 24 shows a power spectrum calculated by a CT sensor.

In step S810, the harmonic determination unit 84 of the abnormality determination unit 56 acquires the power spectrum of the corresponding CT sensors 7 from the management database 54. In harmonic abnormality determination, the power spectrum is acquired for all the CT sensors 7. The power spectrum is calculated from the current waveform in the measurement component 71 of the CT sensor 7, and the harmonic determination unit 84 acquires the power spectrum of the fundamental wave, the third harmonic, and the fifth harmonic. FIG. 24 is a graph of a power spectrum.

Next, in step S820 the harmonic determination unit 84 calculates the distortion rate (also referred to as the relative harmonic content) produced by the n-th harmonic from the power spectrum. A harmonic abnormality determination unit 561 uses the power spectrum (dB) of the fundamental wave, the third harmonic, and the fifth harmonic to calculate the relative harmonic content for each frequency (the ratio of the harmonic power spectrum of a specific order to the fundamental wave power spectrum). If we let a(dB) be the fundamental wave power spectrum, and let bn(dB) be the power spectrum of the n-th harmonic (b3 for the third harmonic and b5 for the fifth harmonic), the distortion rate can be found from the following Formula 10.

$$\text{distortion rate}=10^{((bn/a)/20)} \times 100(\%), n=3, 5 \qquad \text{Formula 10}$$

The distortion rate produced by the third harmonic and the distortion rate produced by the fifth harmonic are calculated in this way.

Next, in step S830 the harmonic determination unit 84 determines whether or not the two calculated distortion rates are over a third threshold set for each. Here, the management database 54 stores first, second, and third thresholds that have been preset. The values are set to increase in the order of the first threshold, the second threshold, and the third threshold, and the warning level increases in order.

In step S830, if the harmonic determination unit 84 determines that either of the two calculated distortion rates is over the third threshold, then in step S840 the abnormality registration unit 85 stores that the warning level is 3.

Also, if neither of the distortion rates is over the third threshold in step S830, the harmonic determination unit 84 determines whether or not the two distortion rates are over the second threshold set for each in step S850.

In step S850, if it is determined by the harmonic determination unit 84 that either of the two calculated distortion rates is over the second threshold, then in step S860 the abnormality registration unit 85 stores that the warning level is 2.

If neither of the two distortion rates is over the second threshold in step S850, the harmonic determination unit 84 determines in step S870 whether or not the two distortion rates are over the first distortion threshold set for each.

In step S870, if it is determined by the harmonic determination unit 84 that either of the two calculated distortion rates is over the first threshold, then in step S880 the abnormality registration unit 85 stores that the warning level is 1.

In step S870, if neither of the two distortion rates is over the first threshold, the harmonic determination unit 84 determines in step S890 that there is no abnormality.

After the above steps S840, S860, S880, and S890, the processing proceeds to step S900. Steps S810 to S890 are repeated until determination of abnormality has been performed for all the data acquired in order to determine harmonic abnormality.

Figure 25:
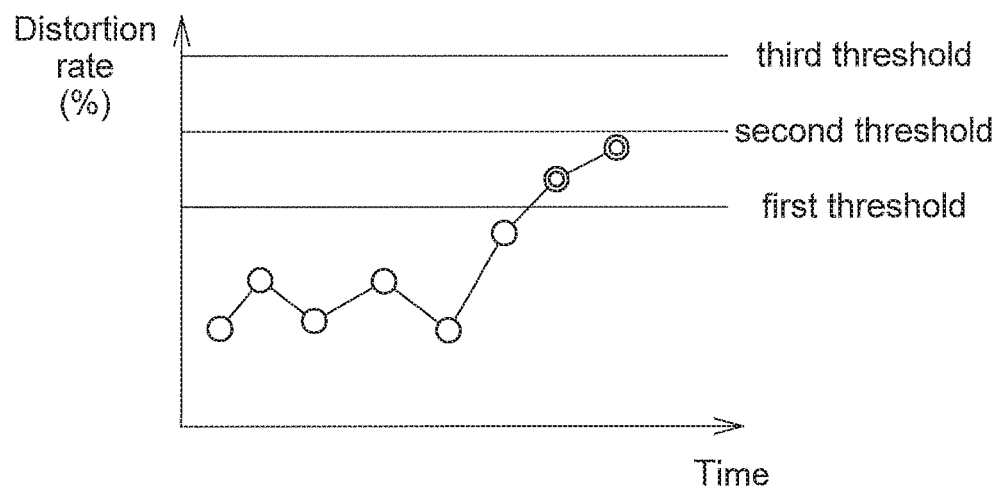
FIG. 25 is a graph of the change over time in the distortion rate.

FIG. 25 is a graph of the change over time in the distortion rate. The data indicated by a double circle in the graph is understood to be warning level 1 because it lies between the first threshold and the second threshold.

When an attempt is made to detect the above four types of abnormalities and there is only one type of abnormality (step S36), in step S37 an abnormality log is stored in the management database 54 by the abnormality management table 96 shown in FIG. 13.

Other Embodiments

An embodiment of the present invention was described above, but the present invention is not limited to or by the above embodiment, and various modifications are possible without departing from the gist of the invention.

(A)

The power distribution network monitoring system 1 in the above embodiment detects four types of abnormalities, namely, overload abnormalities, imbalance abnormalities, loss abnormalities, and harmonic abnormalities, but may detect one or more kinds of abnormality.

If any of these four types of abnormality is not to be detected, the configuration corresponding to the detection of that type of abnormality need not be provided. For instance, when checking only for overload abnormalities, the imbalance determination unit 82, the loss determination unit 83, and the harmonic determination unit 84 need not be provided in the abnormality determination unit 56 shown in FIG. 4. Also, when checking only for overload abnormalities and imbalance abnormalities, the loss determination unit 83 and the harmonic determination unit 84 need not be provided in the abnormality determination unit 56 shown in FIG. 4.

An example of the detection data of the present invention corresponds to, but is not limited to, the effective value of the current and the power spectrum of the fundamental wave, the third harmonic, and the fifth harmonic. For example, when not checking for harmonic abnormalities, the CT sensors 7 need not calculate the power spectrum. Also, when checking only for harmonic abnormalities, the CT sensors 7 need not calculate the effective value of the current.

(B)

With the power distribution network monitoring system 1 in the above embodiment, measurement information about the CT sensors 7 is temporarily collected by the data collecting relays 6 and then transmitted to the power management device 51, but this is not the only option.

For example, the data collection relay 6 need not be provided to the power distribution network monitoring system 1, in which case measurement information is transmitted wirelessly, directly from the CT sensor 7 to the power management device 51.

(C)

With the power distribution network monitoring system 1 in the above embodiment, the effective value of the current and the power spectrum are calculated by the CT sensors 7, but this is not the only option. For example, some or all of the data detected by the CT sensors 7 may be transmitted to the data collection relay 6, and the data collection relay 6 may calculate the effective value of the current or power spectrum. Furthermore, the effective value of the current or the power spectrum need not be calculated in the data collection relay 6, and the effective value of the current or power spectrum may be calculated in the power management device 51 instead.

(D)

In the above embodiment, the power management device 51 is provided with the abnormality determination unit 56, and the power management device 51 determines whether there is an abnormality, but this is not the only option.

(D-1)

Figure 26:
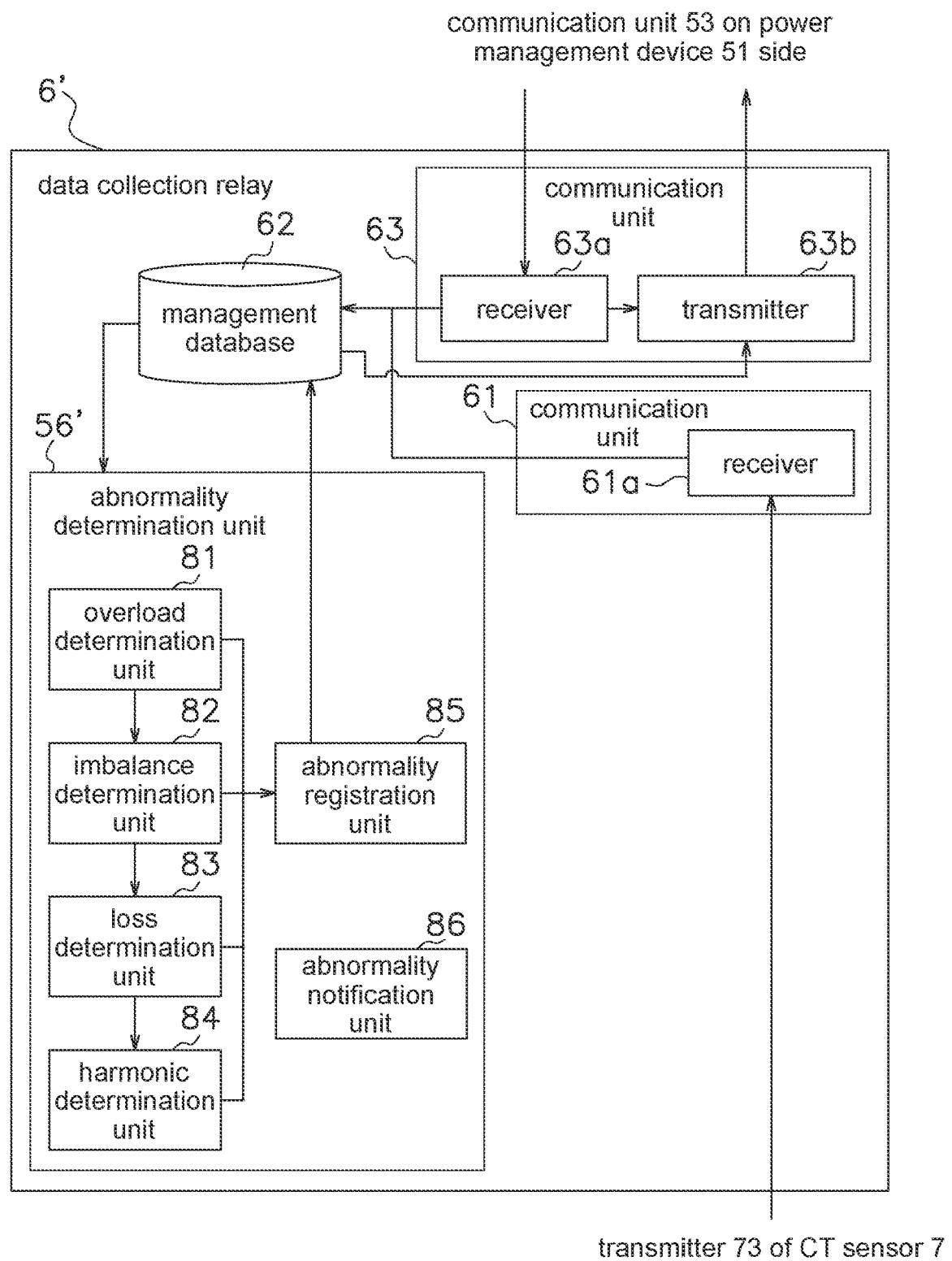
FIG. 26 is a block diagram of the configuration in a modification example of a data collection relay.

For example, as shown in FIG. 26, an abnormality determination unit 56' having an overload determination unit 81, an imbalance determination unit 82, a loss determination unit 83, a harmonic determination unit 84, and an abnormality registration unit 85 may be provided to a data collection relay 6', and abnormalities may be determined by the data collection relay 6'.

With a configuration in which the determination of abnormalities is performed by this data collection relay 6', the data collection relay 6' corresponds to an example of the management device of the present invention, and the power management device 51 corresponds to an example of the host management device of the present invention. Also, just detection result data about an abnormality detected by the data collection relay 6' may be transmitted from the data collection relay 6' to the power management device 51. This detection result data about an abnormality is, for example, data indicating the state shown in FIG. 13 (whether or not there is an abnormality, the type of abnormality, and the level of abnormality). The power management device 51 stores the abnormality detection result data in the management database 54 in association with a relay management code (an example of relay identification information) and a sensor ID (an example of measuring instrument identification information).

Furthermore, the data collection relay 6 may determine some of the four types of abnormality, and the power management device 51 may determine other abnormalities.

(D-2)

Figure 27:
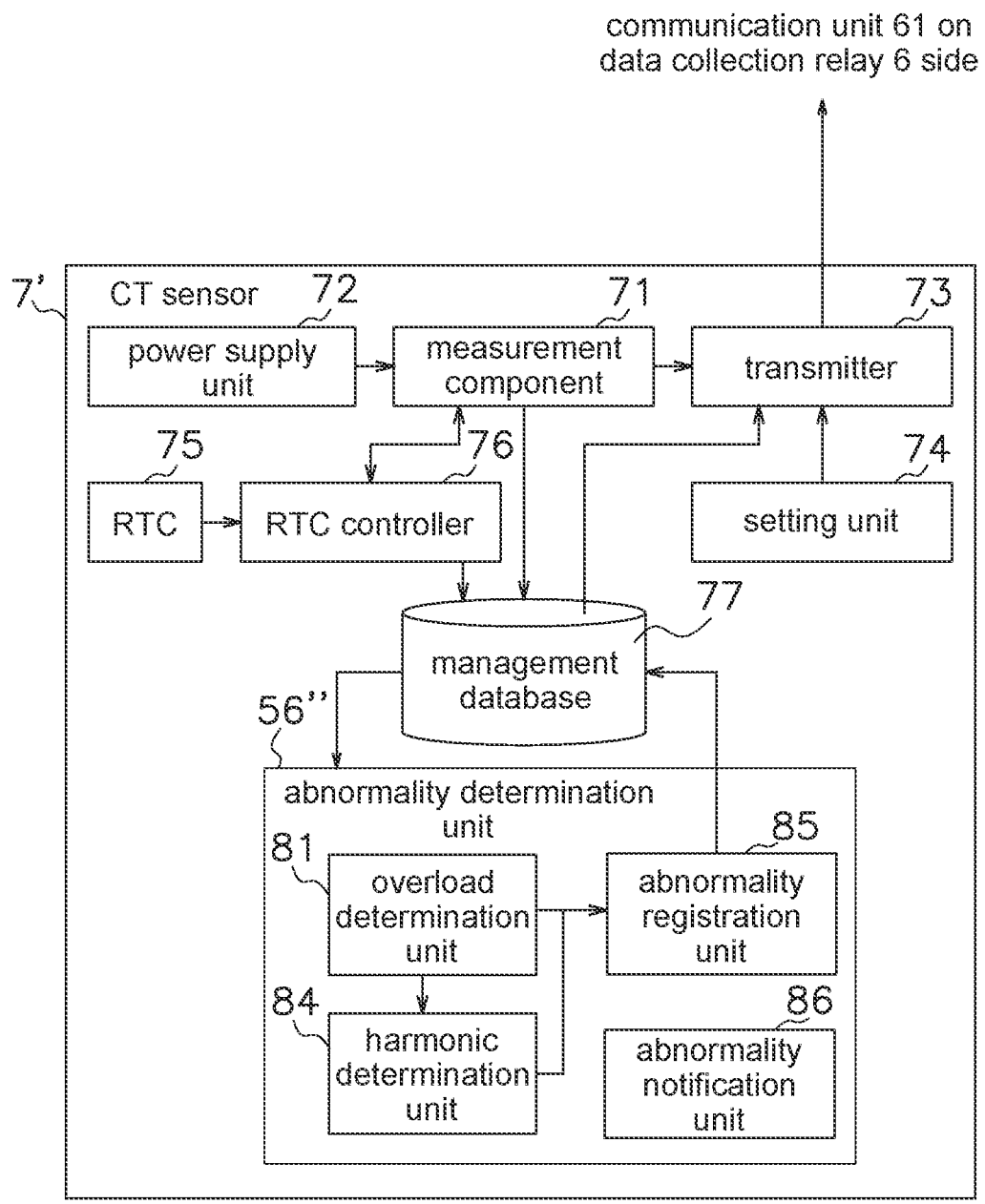
FIG. 27 is a block diagram of the configuration in a modification example of a CT sensor.

Also, the overload determination unit 81 and the harmonic determination unit 84 may be provided to the CT sensor 7, and the CT sensor 7 may perform abnormality determination. A CT sensor 7' configured this way is shown in FIG. 27. The CT sensor 7' is provided with an abnormality determination unit 56" having the overload determination unit 81, the harmonic determination unit 84, and the abnormality registration unit 85, and a management database 77. Since measurement information from a plurality of CT sensors 7 is required for determination of loss abnormality and imbalance abnormality, a determination cannot be made with measurement information from a single CT sensor 7. Therefore, data about the effective value of the current is transmitted from the transmitter 73 to the data collection relay 6 as detection data.

The abnormality determination unit 56' determines an abnormality, and the detection result data for that abnormality is stored in the management database 77 along with time information.

Also, in response to a data request from the data collection relay 6, the management database 77 of the CT sensor 7 sends the effective current value, the detection result for an overflow abnormality, and the detection result for a harmonic abnormality to the data collection relay 6 and the power management device 51, along with the sensor ID and time information. The data collection relay 6 and the power management device 51 then store the detection result in association with the sensor ID and the time information.

(E)

In the above embodiment, a configuration was described in which, in the determination of loss abnormality, branch lines (the distribution lines 106 and 109) were provided on the distribution line 105, which is a trunk line, but it is also possible to check for a loss abnormality on a trunk line not provided with a branch line and that does not branch off.

For example, the occurrence of power theft or leakage can be suspected if the distribution line 103, which is the R-phase trunk line in FIG. 2, is not provided with a branch line, but a comparison of the effective value of the current of the CT sensor 7a installed on the entrance side to the effective value of the current of the CT sensor 7d installed on the exit side reveals that an amount of loss greater than the amount of attenuation is occurring.

(F)

In the above embodiment, the power management device 51 has the abnormality notification unit 86 as an example of the notification unit of the present invention, and the power management device 51 performs notification of an abnormality, but if abnormality determination is performed in the data collection relay 6, then the data collection relay 6 may have the abnormality notification unit 86, as described in (D-1) above. Also, if abnormality determination is performed in the CT sensor 7, then the CT sensor 7 may have the abnormality notification unit 86, as described in (D-2) above.

In addition, the notification of an abnormality is not limited to notification to the maintenance management center 4, and may also involve emitting light or a sound.

(G)

In the above embodiment, the RTC 75 and the RTC controller 76 are provided to the CT sensor 7, but the RTC 75 and the RTC controller 76 need not be provided to the CT sensor 7, and the RTC 75 and the RTC controller 76 may be provided to the data collection relay 6 instead. That is, although time information is transmitted from the CT sensor 7 to the data collection relay 6 in the above embodiment, the present invention is not limited to this, and time information may be added to the data when the collection relay 6 receives data from the CT sensor 7.

Figure 28:
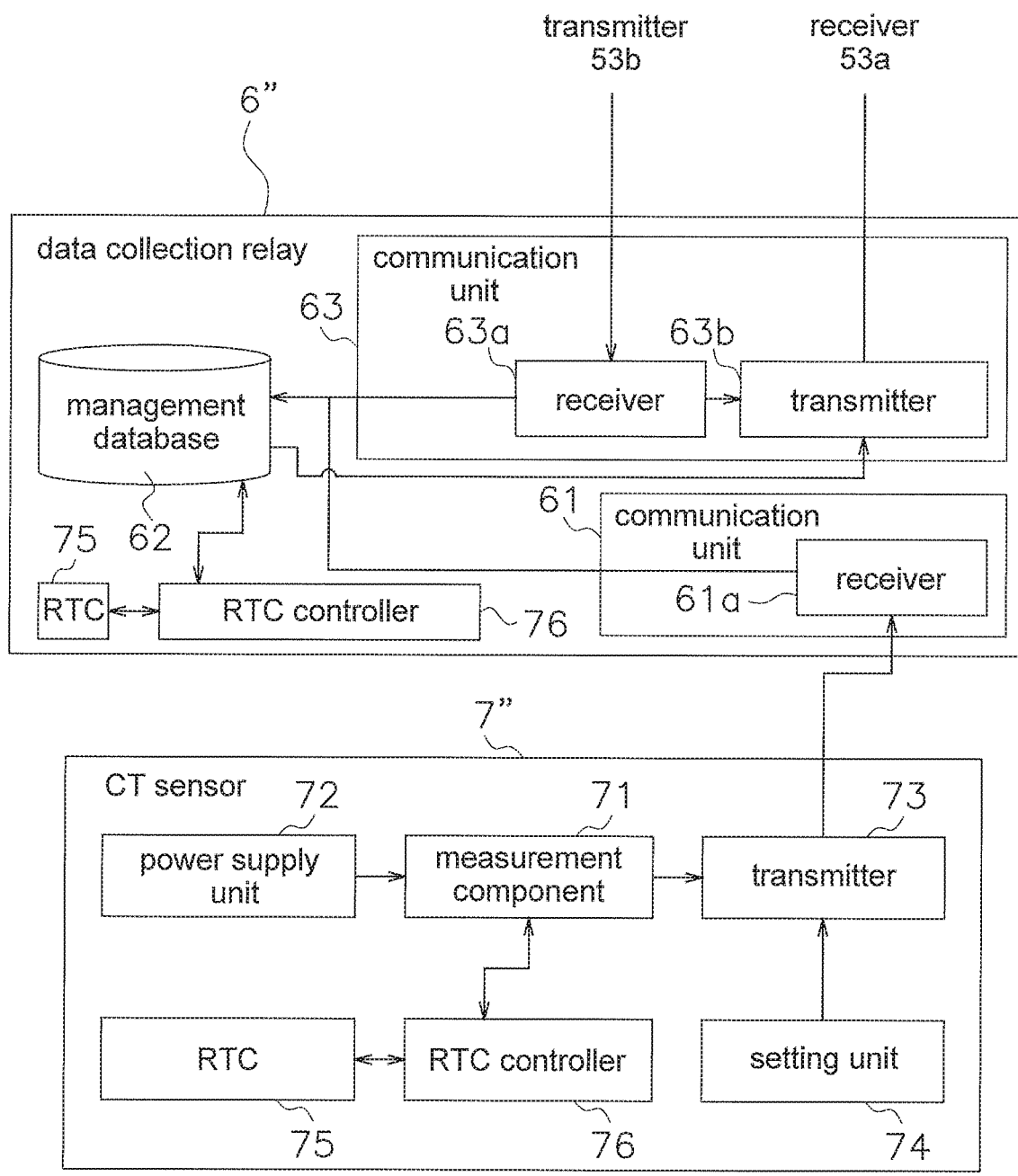
FIG. 28 is a block diagram of the configuration in a modification example of a data collection relay and a CT sensor.

FIG. 28 is a block diagram of a CT sensor 7" that is not provided with the RTC 75 and the RTC controller 76, and a data collection relay 6" that is provided with the RTC 75 and the RTC controller 76.

The CT sensor 7" shown in FIG. 28 transmits the detection data (the effective value, and the power spectrum of the fundamental wave, the third harmonic, and the fifth harmonic) to the data collection relay 6" every time it is measured by the measurement component 71. With the data collection relay 6", the RTC controller 76 transmits the time information acquired from the RTC 75 to the management database 62, and the management database 62 adds the time information to the detection data transmitted from the CT sensor 7" and stores the result (see the measurement information table 92 in FIG. 8).

Also, the transmitter 63b of the data collection relay 6" transmits a relay management code, a sensor ID, item information, and detection data to the power management device 51.

(H)

In the above embodiment, the proportional content of the third harmonic and the fifth harmonic with respect to the fundamental wave is calculated, but just one of these may be calculated. Furthermore, the harmonic abnormality determination unit 561 may detect harmonics by calculating the proportional content of seventh and higher harmonics.

(I)

In the above embodiment, the distortion rate is calculated using Formula 10, and it is determined that a harmonic is included when the distortion rate is over a certain threshold, but this is not the only option, and it is only necessary to be able to detect that the fundamental wave contains a harmonic.

For example, it may be determined that the n-th harmonic is included when the power spectrum value (dB) of the n-th harmonic (n=3, 5, 7, etc.) is at or over a certain threshold.

Also, it may be determined that the n-th harmonic is included when the ratio of the effective value of the n-th harmonic to the effective value of the fundamental wave is at or over a certain threshold.

(J)

In the above embodiment, as the control method for a power distribution network monitoring system and abnormality detection method, an example of implementing the control method and the abnormality detection method as shown in the flowcharts of FIGS. 5, 6, 9, 14, 15, 17A, 17B, 20A, 20B, and 23 was described, but this is not the only option.

For example, an abnormality detection program that causes a computer to execute an abnormality detection method implemented according to the flowcharts shown in FIGS. 5, 6, 9, 14, 15, 17A, 17B, 20A, 20B and 23 may be implemented as the present invention.

Also, one usage mode of the program may be mode in which this program is recorded on a ROM or other such recording medium that can be read by a computer, and operates in conjunction with the computer.

Also, one usage mode of the program may be mode in which the program is transmitted over the Internet or another such transmission medium, or through a transmission medium such as light, radio waves, or sound waves, is read by a computer, and operates in conjunction with a computer.

The computer mentioned above may be one that includes not only hardware such as a CPU, but also firmware, an OS, and peripheral devices.

As described above, the abnormality detection method may be realized as software or hardware.

INDUSTRIAL APPLICABILITY

The power distribution network monitoring system of the present invention has the effect of being able to quickly detect abnormalities at low cost, and is widely applicable, for example, to the monitoring of power distribution networks in countries where power infrastructure is underdeveloped, such as India and ASEAN countries.

REFERENCE SIGNS LIST

1: power distribution network monitoring system
2: power management center
2: first power management center
3: second power management center
4: maintenance management center
5: power management center
6: data collection relay (example of a management device; example of a relay)
6a: data collection relay
6b: data collection relay
7: CT sensor (example of measuring instrument)
7a: CT sensor (example of measuring instrument)
7b: CT sensor (example of measuring instrument)
7c: CT sensor (example of measuring instrument)
7d: CT sensor (example of measuring instrument)
7e: CT sensor (example of measuring instrument)
7f: CT sensor (example of measuring instrument)
7g: CT sensor (example of measuring instrument)
7h: CT sensor (example of measuring instrument)
10: power distribution network system
21: first power management device
22: management database
23: display unit
24: communication unit
24a: receiver
24b: transmitter
31: second power management device
32: management database
41: maintenance management device
42: display unit
43: abnormality receiver
51: power management device (example of a management device; example of a host management device)
52: display unit
53: communication unit 53a: receiver (example of the receiver of the management device)
53b: transmitter
54: management database (example of the storage component of the management device)
55: communication unit
55b: transmitter
56: abnormality determination unit (example of an abnormality detector)
61: communication unit
61a: receiver (example of the receiver of the management device)
62: management database (example of the storage component of the management device)
63: communication unit
63a: receiver
63b: transmitter (example of the transmitter of the management device)
71: measurement component (example of a measurement component)
72: power supply unit
73: transmitter (example of the transmitter of the measurement component)
74: setting unit
75: RTC
76: RTC controller
77: management database
81: overload determination unit
82: imbalance determination unit
83: loss determination unit
84: harmonic determination unit
85: abnormality registration unit
86: abnormality notification unit
91: setting information table
92: measurement information table
93: setting information table
94: measurement information table
95: position information management table
96: abnormality management table
100: power distribution network (example of power distribution network)
101: power pole
102: power pole
103: distribution line (example of a power line)
104: distribution line (example of a power line)
105: distribution line (example of a power line)
106: distribution line (example of a power line)
107: house
108: house
109: distribution line

The invention claimed is:

1. A power distribution network monitoring system, comprising:
a measuring instrument including:
measurement components configured to be installed at a plurality of predetermined positions along a power line constituting a power distribution network and perform electrical measurement of the power line at each of predetermined positions; and
a transmitter configured to transmit wirelessly, as transmission data, a detection data that is at least part of data measured by the measurement components and is used for a detection of abnormalities in the power distribution network and/or a detection result data about a result of using the detection data to perform abnormality detection;
a management device including:
a receiver configured to receive the transmission data, which includes the detection data and/or the detection result data; and
a storage component configured to store the detection data and/or the detection result data;
an abnormality detector provided in one of the measuring instrument and the management device and configured to use the detection data to detect abnormalities in the power distribution network to obtain the detection result data; and
a notification unit provided in one of the measuring instrument and the management device and configured to send a notification of the detection result data when the abnormality detector detects an abnormality.

2. The power distribution network monitoring system according to claim 1,
wherein the transmission data includes the detection data,
the management device includes the abnormality detector and the notification unit, and
the storage component of the management device is configured to store detection result data about results of abnormality detection.

3. The power distribution network monitoring system according to claim 2,
further comprising a relay configured to receive wirelessly the detection data from the plurality of measuring instruments, and transmits the detection data to the receiver of the management device,
wherein the receiver of the management device is configured to receive the detection data via the relay.

4. The power distribution network monitoring system according to claim 2,
wherein the abnormality detector is configured to detect at least one of following kinds of abnormality: an abnormality related to overload, an abnormality related to the balance of power in three power lines constituting three phases, an abnormality related to power loss, and an abnormality related to a harmonic wave.

5. The power distribution network monitoring system according to claim 4,
wherein the notification unit is configured to send a notification about a type of the abnormality when the abnormality detector detects any of the abnormalities.

6. The power distribution network monitoring system according to claim 2,
wherein the detection data includes information about an effective value of current of the power line, and
the abnormality detector is configured to detect abnormalities in the power distribution network based on the effective value of the current.

7. The power distribution network monitoring system according to claim 2,
wherein the detection data includes information about a fundamental wave of the current of the power line and about harmonic waves with respect to the fundamental wave, and
the abnormality detector is configured to detect abnormalities in the power distribution network on the basis of information about the fundamental wave and the harmonics of the current.

8. The power distribution network monitoring system according to claim 2,
wherein the detection data includes information about an effective value of current of the power line, and the abnormality detector is configured to detect occurrence of an abnormality related to overload at the predetermined position when the effective value is above a preset threshold.

9. The power distribution network monitoring system according to claim 8,
wherein a plurality of the thresholds are set such that the value increases stepwise, and
the abnormality detector is configured to determine that degree of abnormality is greater in proportion to how much a large threshold is exceeded.

10. The power distribution network monitoring system according to claim 2,
wherein the detection data includes information about an effective value of current of the power line,
the measuring instruments are attached to each of three power lines arranged in parallel to form three phases, and
the abnormality detector is configured to detect occurrence of an abnormality related to balance of power in the three power lines based on the effective value of each of the power lines.

11. The power distribution network monitoring system according to claim 10,
wherein an average effective value is an average of the effective values obtained in a predetermined period for each of the three power lines,
an overall average value is an average of three average effective values of the three power lines,
a diverging average effective value is the most deviated average effective value with respect to the overall average value among the three average effective values, and
the abnormality detector is configured to detect that balance abnormality has occurred in the three power lines when a degree of deviation from the overall average value of the diverging average effective value is larger than a preset threshold.

12. The power distribution network monitoring system according to claim 2,
wherein the detection data includes information about an effective value of current of the power line,
the measuring instruments are provided at two places along a specific power line of the power distribution network and to all of branch lines branching off from between the two points of the specific power line, and
the abnormality detector is configured to detect that an abnormality related to power loss between the two locations of the specific power line has occurred based on the effective values at the two locations of the specific power line and of the effective values of all the branch lines.

13. The power distribution network monitoring system according to claim 12,
wherein an average effective value is an average of the effective values obtained in a predetermined period for each of the branch line and each of the two locations,
the abnormality detector is configured to detect that an abnormality related to power loss has occurred when a ratio of a loss amount to a usage amount is above a predetermined threshold,
the usage amount is a sum of the average effective values of all of the branch lines,
the loss amount is a remainder of subtracting the usage amount from a reduction amount, and
the reduction amount is a difference between the average effective value on an upstream side, and the average effective value on a downstream side, out of the two locations of the specific power line.

14. The power distribution network monitoring system according to claim 2,
wherein the detection data includes information about an effective value of current of the power line,
the measuring instruments are provided at two locations of a specific power line of the power distribution network, and
the abnormality detector is configured to detect that an abnormality related to power loss has occurred between the two locations of the specific power line based on the effective values at the two locations of the specific power line.

15. The power distribution network monitoring system according to claim 2,
wherein the detection data includes information about a fundamental wave of current of the power line and about harmonics with respect to the fundamental wave,
the information about the fundamental wave and the harmonics is a power spectrum of the fundamental wave and the harmonics obtained from the current, and
the abnormality detector is configured to detect that an abnormality related to harmonics has occurred when a ratio of the harmonics to the fundamental wave is above a preset threshold.

16. The power distribution network monitoring system according to claim 1,
wherein the measuring instruments each include the abnormality detector and the notification unit,
the transmission data includes the detection result data obtained from the abnormality detector,
the receiver of the management device is configured to receive the detection result data, and
the storage component of the management device is configured to store the detection result data.

17. The power distribution network monitoring system according to claim 16,
wherein the abnormality detector is configured to detect at least one of following kinds of abnormality: an abnormality related to overload and an abnormality related to a harmonic wave.

18. The power distribution network monitoring system according to claim 1,
wherein the measuring instruments each includes a storage component configured to store detection result data.

19. The power distribution network monitoring system according to claim 1,
wherein the measuring instruments further include a power supply unit configured to make use of electricity flowing through the power line to supply power to the measurement component.

20. A power distribution network monitoring system comprising:
a measuring instrument including:
measurement components configured to be installed at a plurality of predetermined positions along a power line constituting a power distribution network and perform electrical measurement of the power line at each of predetermined positions; and
a first transmitter configured to transmit wirelessly, a detection data that is at least part of data measured by the measurement components and is used for a detection of abnormalities in the power distribution network; and
a management device including:

a first receiver configured to receive the detection data;
an abnormality detector configured to use the detection data to detect abnormalities in the power distribution network to obtain a detection result data;
a first storage component configured to store the detection data and the detection result data about results of abnormality detection; and
a second transmitter configured to transmit the detection result data; and
a host management device including:
a second receiver configured to receive the detection result data transmitted from the management device; and
a second storage component configured to store the detection result data,
wherein the management device relays data so as to receive the detection data from the measuring instruments and transmit the detection result data to the host management device.

21. A power distribution network monitoring system, comprising:
a measuring instrument including:
measurement components configured to be installed at a plurality of predetermined positions along a power line constituting a power distribution network and perform electrical measurement of the power line at each of predetermined positions; and
a transmitter configured to transmit wirelessly, as transmission data, detection data that is at least part of data measured by the measurement components and is used for a detection of abnormalities in the power distribution network and/or detection result data about a result of using the detection data to perform abnormality detection; and
a management device including:
a receiver configured to receive the transmission data; and
a storage component configured to store a received data,
wherein the storage component of the management device is configured to store the transmission data in association with at least one of measuring instrument identification information unique to the measurement device and time information related to the transmission data.

22. The power distribution network monitoring system according to claim 21,
wherein the measuring instrument is configured to transmit the time information along with the transmission data, and
the storage component of the management device is configured to store the transmission data in association with the time information.

23. The power distribution network monitoring system according to claim 21,
wherein the storage component of the management device is configured to give the transmission data the time information, and store the transmission data in association with the time information.

24. The power distribution network monitoring system according to claim 21,
wherein the transmitter of the measuring instrument is configured to transmit the measuring instrument identification information along with the transmission data, and
the storage component of the management device is configured to associate and store the measuring instrument identification information, and information related to the installation location of each of the measuring instruments.

25. The power distribution network monitoring system according to claim 21,
further comprising a plurality of relays configured to relay the transmission data between the measuring instruments and the management device,
wherein the plurality of measuring instruments are divided into a plurality of groups,
each of the relays is configure to receive the transmission data and the measuring instrument identification information from the plurality of measuring instruments belonging to each of these groups, and transmits to the management device relay identification information unique to the relay, along with the transmission data and the measuring instrument identification information, and
the storage component of the management device is configured to store the transmission data in association with the measuring instrument identification information and the relay identification information.

* * * * *